United States Patent
Kitahara et al.

(10) Patent No.: US 6,710,371 B2
(45) Date of Patent: Mar. 23, 2004

(54) SEMICONDUCTOR INTEGRATED CIRCUIT DEVICE WITH ENHANCED LAYOUT

(75) Inventors: Terumasa Kitahara, Kasugai (JP); Koichi Yasuda, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/040,460

(22) Filed: Jan. 9, 2002

(65) Prior Publication Data

US 2002/0190255 A1 Dec. 19, 2002

(30) Foreign Application Priority Data

Jun. 18, 2001 (JP) ........................................ 2001-183911

(51) Int. Cl.$^7$ .............................................. H01L 27/10
(52) U.S. Cl. .......................... 257/69; 257/208; 257/69; 257/204
(58) Field of Search .......................... 257/67, 266, 206, 257/202, 211, 909; 716/9; 326/101

(56) References Cited

U.S. PATENT DOCUMENTS

| 5,635,737 A | * | 6/1997 | Yin | .............................. | 257/204 |
| 5,995,734 A | * | 11/1999 | Saika | .............................. | 716/9 |
| 6,335,640 B1 | * | 1/2002 | Okamoto | .................... | 326/101 |

FOREIGN PATENT DOCUMENTS

GB 2300983 * 11/1996 ....... H03K/19/0948

* cited by examiner

Primary Examiner—David Nelms
Assistant Examiner—Thinh T Nguyen
(74) Attorney, Agent, or Firm—Arent Fox Kintner Plotkin & Kahn

(57) ABSTRACT

There is provided a semiconductor integrated circuit device wherein functional circuit groups are arranged on a chip in a direction spreads, which aims to enhance layout efficiency and to prevent deterioration of element characteristics. A unit wiring region IL1P is constituted outside of a power voltage wiring VCC, a part of a second region BIP and a unit wiring region IL1N is constituted outside of a reference voltage wiring VSS, a part of a second region BIN. Within the second wiring regions BIP and BIN, connection wirings 11, 12A, 13, 14 are wired. These connection wirings connect between units within the logic circuits CIA11, CIR12 or between the logic circuits CIR11, CIR12. There is only arranged an input/output wiring region IOL1 on a first region A1 located between the power voltage wiring VCC1 and the reference voltage wiring VSS1. Since no unit wiring region exists in the first region A1, width of the first region A1 can be laid-out short. Accordingly, connection wiring between PMOS/NMOS transistors can be shortened, areas of an N-type well region NW1 and a P-type well region PW1 can be made small. Layout efficiency and circuit characteristic can be enhanced, as a result.

19 Claims, 28 Drawing Sheets

LAYOUT DIAGRAM DIRECTED TO FIRST EMBODIMENT

LAYOUT DIAGRAM DIRECTED TO FIRST EMBODIMENT

CONTENTS OF CONTACT
- ■ BETWEEN FIRST METAL LAYER AND SECOND METAL LAYER (Cv)
- ▦ BETWEEN SECOND METAL LAYER AND POLY-SILICON (Cpp)
- ▨ BETWEEN FIRST METAL LAYER AND DEFFUSED LAYER

LAYOUT DIAGRAM DIRECTED TO SECOND EMBODIMENT

LAYOUT DIAGRAM DIRECTED TO THIRD EMBODIMENT

CONTENTS OF CONTACT
- ■ BETWEEN FIRST METAL LAYER AND SECOND METAL LAYER (Cv)
- ▨ BETWEEN SECOND METAL LAYER AND POLY-SILICON (Cpp)
- ▨ BETWEEN FIRST AND SECOND METAL LAYER AND DEFFUSED LAYER

LAYOUT DIAGRAM DIRECTED TO FOURTH EMBODIMENT

CONTENTS OF CONTACT
- ■ BETWEEN FIRST METAL LAYER AND SECOND METAL LAYER (Cv)
- ▦ BETWEEN SECOND METAL LAYER AND POLY-SILICON (Cpp)
- ▨ BETWEEN FIRST METAL LAYER AND DEFFUSED LAYER

FIG.5
RELATIONSHIP BETWEEN UNIT WIRING REGION AND LAYOUT OF NAND GATE (FIFTH EMBODIMENT)
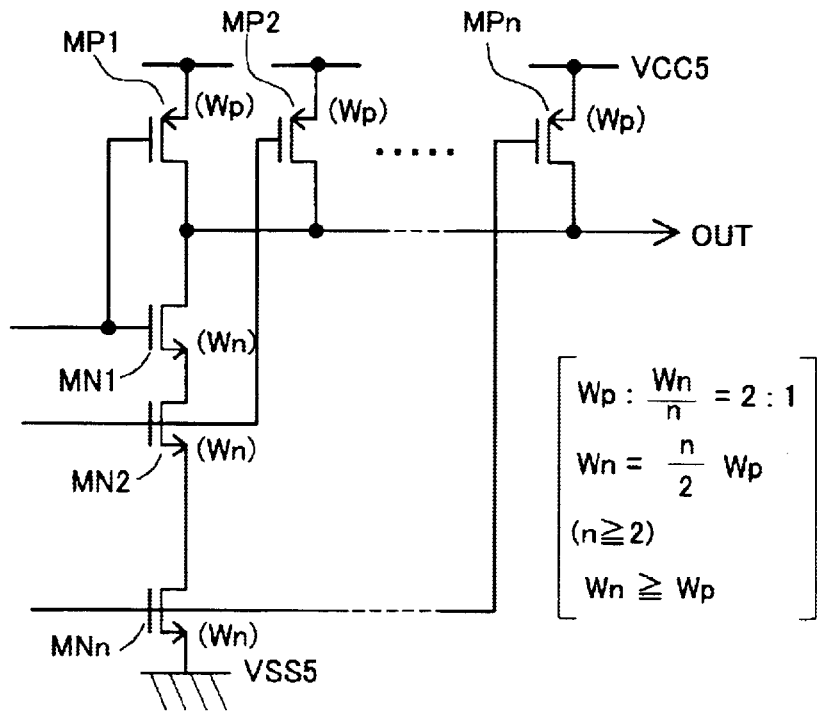
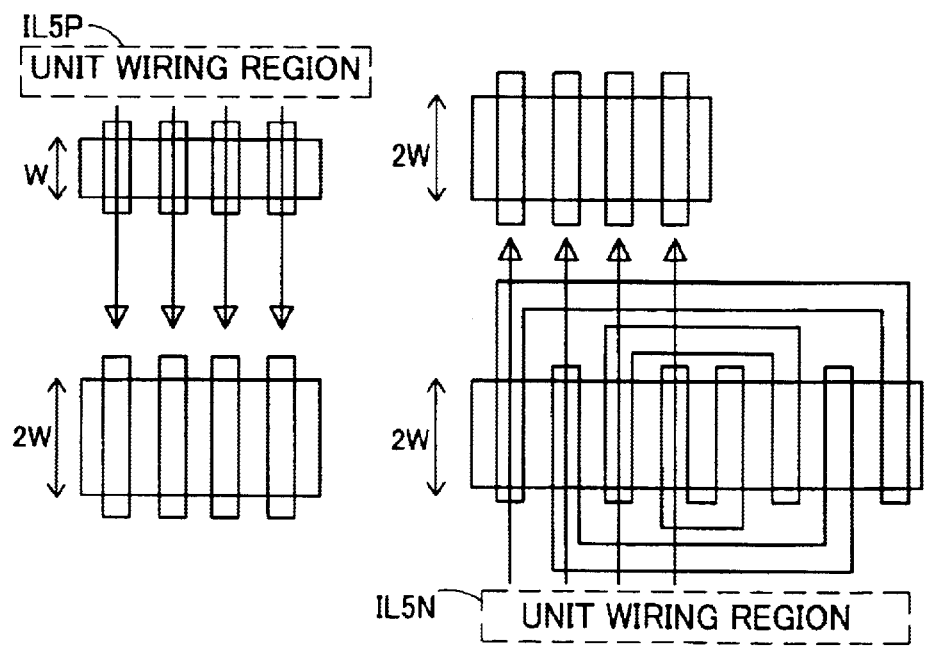

FIG.6
RELATIONSHIP BETWEEN UNIT WIRING REGION AND LAYOUT OF NOR GATE (SIXTH EMBODIMENT)
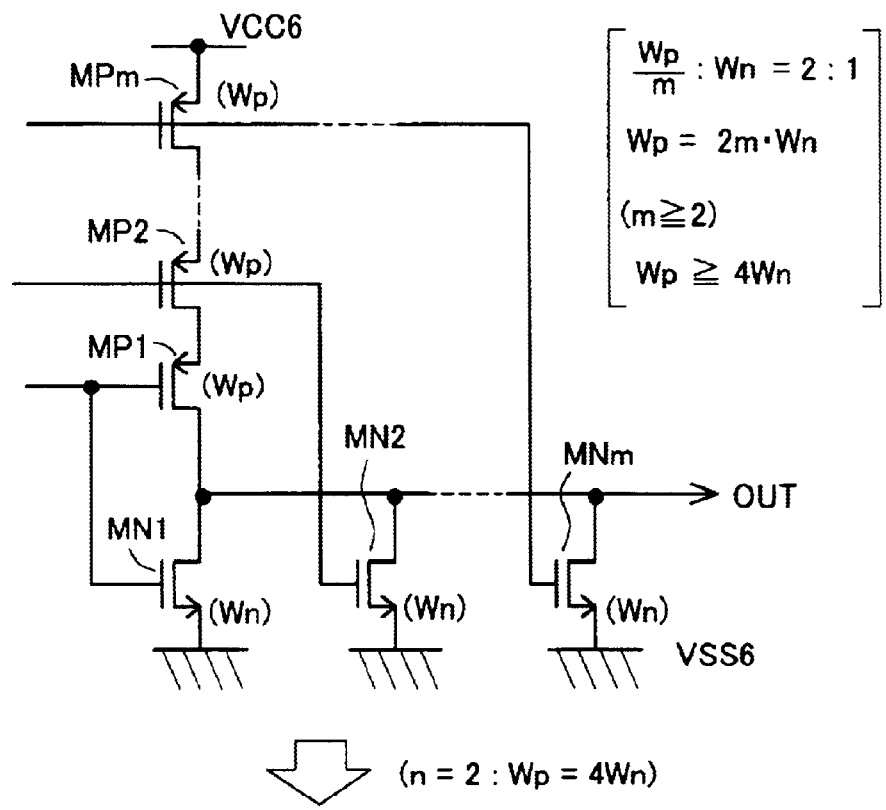
$$\left[ \begin{array}{l} \frac{Wp}{m} : Wn = 2 : 1 \\ Wp = 2m \cdot Wn \\ (m \geq 2) \\ Wp \geq 4Wn \end{array} \right]$$
$(n = 2 : Wp = 4Wn)$
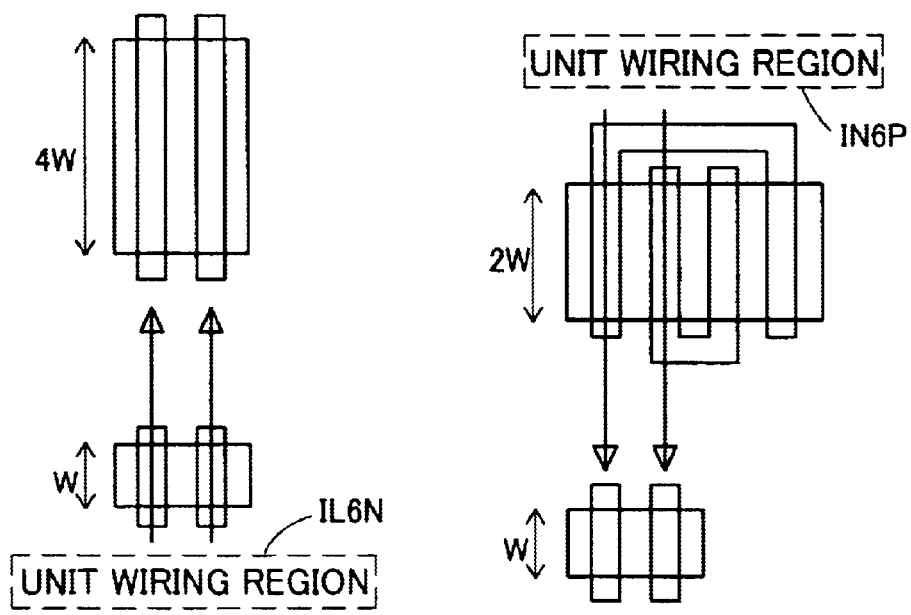

LAYOUT DIAGRAM DIRECTED TO SEVENTH EMBODIMENT

FIG.8 FUNCTIONAL CIRCUIT DIRECTED TO FIG.23 LAID-OUT WITH MANNERS OF FIRST AND THIRD EMBODIMENTS

FIG.9 LOGIC CIRCUIT CIR1 DIRECTED TO FIRST AND THIRD EMBODIMENTS

FIG.10 LOGIC CIRCUIT CIR2 DIRECTED TO FIRST AND THIRD EMBODIMENTS

FIG.11 LOGIC CIRCUIT CIR3 DIRECTED TO FIRST AND THIRD EMBODIMENTS

FIG. 12 LOGIC CIRCUIT CIR4 DIRECTED TO FIRST AND THIRD EMBODIMENTS

FIG.13 FUNCTIONAL CIRCUIT DIRECTED TO FIG.23 LAID-OUT WITH MANNERS OF FOURTH EMBODIMENT

FIG.17  LOGIC CIRCUIT CIR4 DIRECTED TO FOURTH EMBODIMENT

FIG.18 LAYOUT OF FUNCTIONAL CIRCUIT GROUP ON SEMICONDUCTOR INTEGRATED CIRCUIT DEVICE

LAYOUT DIAGRAM SHOWING A PORTION FUNCTIONAL CIRCUIT GROUP ENLARGED

FIG. 20 MULTI-LAYERED WIRING STRUCTURE AT EACH MANUFACTURING PROCESS OF SEMICONDUCTOR INTEGRATED CIRCUIT DEVICE

FIG.21 PRIOR ART LAYOUT DIAGRAM IN CASE PROCESS A DIRECTED TO FIG.20 IS APPLIED

FIG.23 EXAMPLE OF FUNCTIONAL CIRCUIT

FUNCTIONAL CIRCUIT DIRECTED TO FIG.23 LAID-OUT WITH MANNERS OF PRIOR ART

LOGIC CIRCUIT CIR1 DIRECTED TO PRIOR ART

LOGIC CIRCUIT CIR2 DIRECTED TO PRIOR ART

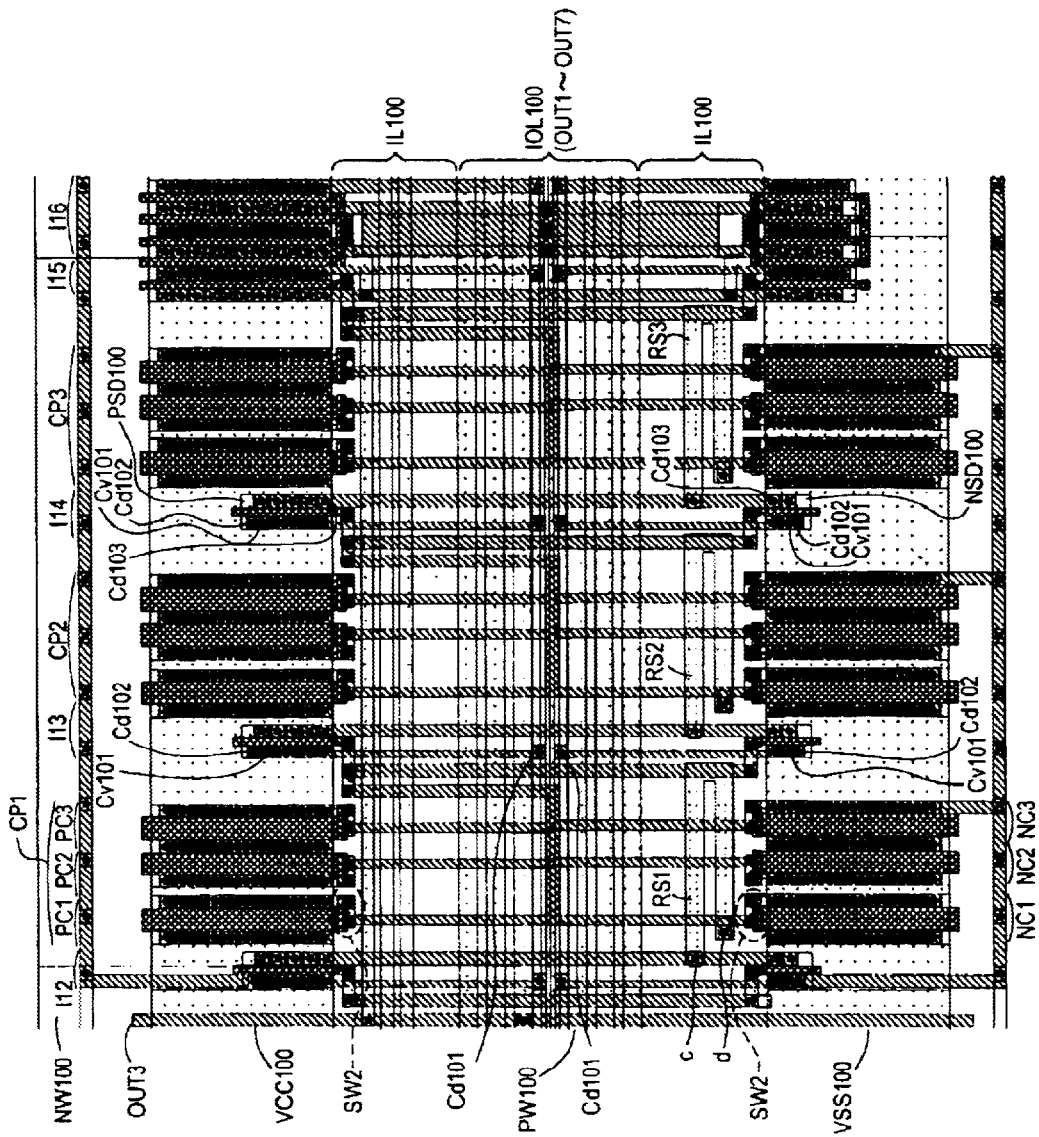
FIG.27 PRIOR ART  LOGIC CIRCUIT CIR3 DIRECTED TO PRIOR ART

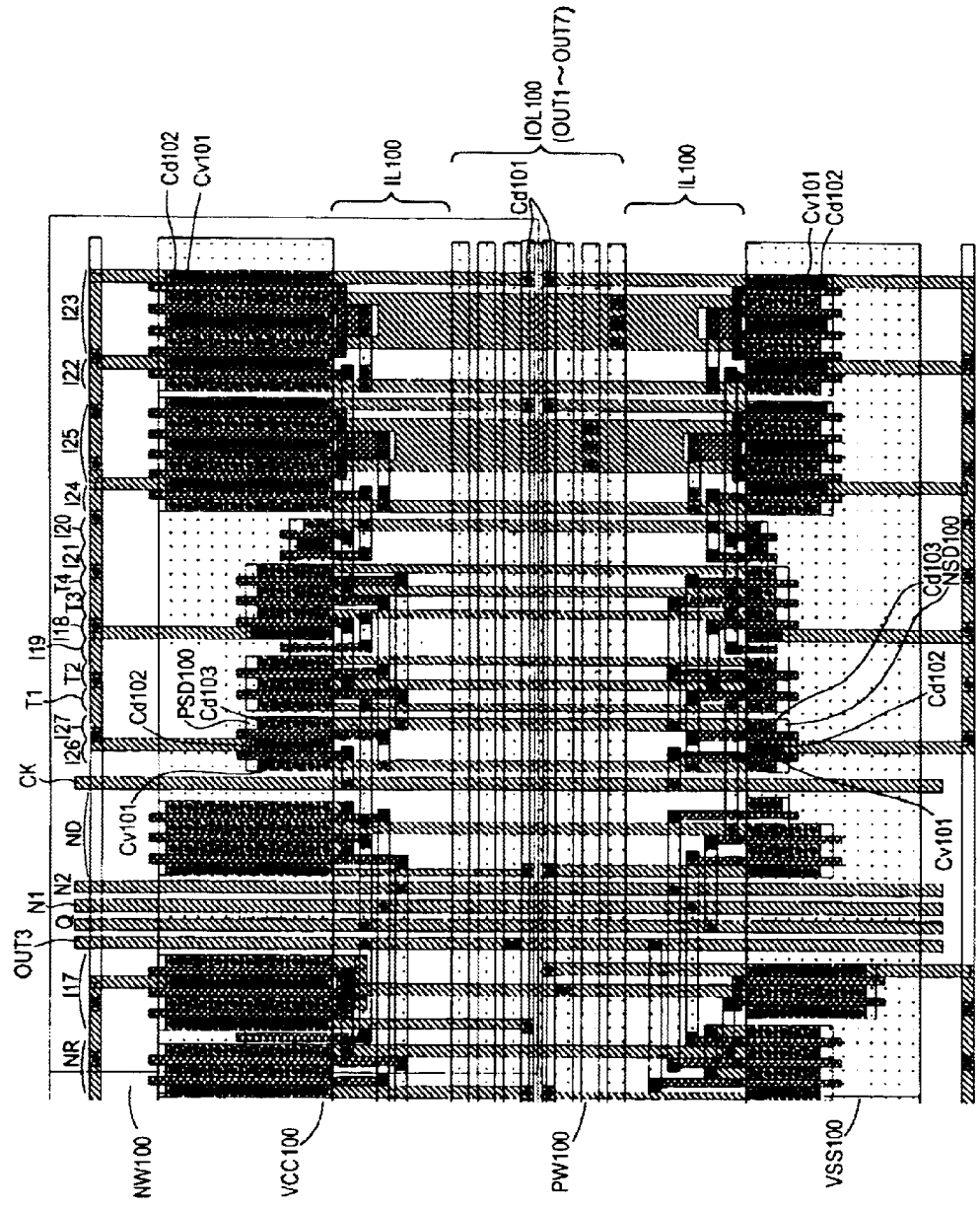
FIG. 28 PRIOR ART   LOGIC CIRCUIT CIR4 DIRECTED TO PRIOR ART

SEMICONDUCTOR INTEGRATED CIRCUIT DEVICE WITH ENHANCED LAYOUT

BACKGROUND OF THE INVENTION

1. Field of the Invention

The present invention relates to layout patterns of semiconductor integrated circuit devices. More specifically, it relates to layout patterns of semiconductor integrated circuit devices constituted such that layouts of functional circuit groups spread in one direction on a chip.

2. Description of Related Art

Conventionally, as one of the manners to meet the needs of higher integration of die size in semiconductor integrated circuit devices, there has been used a layout manner such that arrange functional circuits in a direction along with flow of signals to make up functional circuit groups wherein the functional circuits are constituted by CMOS units composed of pairs of PMOS transistors and NMOS transistors, and a plurality of logic circuits are included therein. This layout manner is applied to semiconductor memory devices such as dynamic random access memory excluding gate array type and standard cell type, i.e., so-called customized products.

It should be noted that CMOS unit or unit mentioned hereinafter indicates some types of unit structured with a pair of one or more PMOS transistors and one or more NMOS transistors, wherein the number of PMOS transistor(s) and that of NMOS transistor(s) are appropriately combined case by case. That is, circuit units that constitute fundamental functions of logic gate, transfer gate, and the like correspond to CMOS unit or unit. Furthermore, a single PMOS transistor or a single NMOS transistor can be classified into a type of unit herein as long as it is used as a capacitance element or a resistance element that has fundamental circuit function. Some elements not constituted by a PMOS transistor or an NMOS transistor are not always classified into unit. For example, a wiring layer switch for trimming, described later, cannot be a unit. This wiring layer switch determines connection between elements to constitute a fundamental circuit element. A group of elements connected by the wiring layer switch constitutes a fundamental circuit element and this corresponds to a unit. Accordingly, each element of the group is not defined as a unit. Furthermore, a capacitance element, a resistance element or the like are not classified into unit, either. This is because elements themselves can be buried in a wiring region and do not influence on element characteristics, layout efficiency or the like.

Layout manners of the gate array type and standard cell type are such that wirings are applied crosswise along a predetermined wiring grid pitch in a certain plot spreading two-dimensionally on a chip. Such layout aims to shorten connection processing time. On the other hand, the layout manner to arrange functional circuit groups in a direction along flow of signals aims to layout circuits with as high integration as possible on a restricted region making full use of restricted wiring layers.

FIG. 18 shows an example of chip layout for a semiconductor integrated circuit device to which three-metal layered processing is applied. A chip for the semiconductor integrated circuit device includes two memory cell regions M1 and M2 spreading in Y-direction. Between the memory cell regions M1 and M2, there are arranged functional circuit groups FNBL1, FNBL2 through FNBLn spreading in X-direction taking layout width BW1, BW2 through BWn, respectively in Y-direction. There are wired a power voltage wiring VCC extending from a power voltage pad VCP and a reference voltage wiring VSS from a reference voltage pad VSP across the functional circuit groups FNBL1, FNBL2 through FNBLn to supply power voltage VCC and reference voltage VSS to the functional circuit groups. Both the power voltage wiring VCC and the reference voltage wiring VSS are wired with a third metal layer M3L, a top layer. For higher circuit integration, each of the functional circuit groups FNBL1, FNBL2 through FNBLn is laid-out taking each of their layout widths at minimum.

FIG. 19 is an enlarged diagram of a portion 100 (shown in FIG. 18) directed to the functional circuit group FNBL1. The portion 100 of the functional circuit group FNBL1 consists of logic circuits CIR110, CIR120, CIR130, and CIR140. Each of the logic circuits CIR110, CIR120, CIR130, and CIR140 constitutes a CMOS unit. For example, in the CIR110, PMOS transistors P1, P2, P3 and NMOS transistors N1, N2, N3 are paired, respectively, to constitute three CMOS units. Connection wirings LV100 connect P-type and N-type MOS transistors. First metal layer M1L, bottom metal wiring layer, is used for the connection wirings LV100. As examples of CMOS units, here are shown an inverter gate, a transfer gate, and the like wherein a PMOS transistor and an NMOS transistor are connected one to one. However, types of CMOS unit are not limited to the above. Various logic gates such as NAND gate, NOR gate, MOS capacitor or the like, and fundamental circuit elements also are constituted with CMOS units. Furthermore, on a layer above of the PMOS transistors, there is wired a power voltage wiring VCC100 for supplying power voltage VCC to the functional circuit group FNBL1 with second metal layer M2L. The power voltage wiring VCC100 and a power voltage VCC wired with third metal layer M3L are connected by VIA contacts CVV at their crossing portion. Similarly, on a layer above of the NMOS transistors, there is wired a reference voltage wiring VSS100 for supplying reference voltage VSS to the functional circuit group FNBL1 with second metal layer M2L. The reference voltage wiring VSS100 and a reference voltage VSS wired with third metal layer M3L (not shown) are connected by VIA contacts at their crossing portion. Furthermore, between the power voltage wiring VCC100 and the reference voltage wiring VSS100 both wired with second metal layer M2L, there are wired internal wirings LH100 in accordance with necessity. In the internal wirings LH100, there are wired: input/output wirings for the functional circuit group FNBL1; internal wirings LH100 for connecting between pairs of PMOS-NMOS for CMOS units or between logic circuits CIR110 through CIR140; and the like. A block width BW1 for the functional circuit group FNBL1 is determined by the following three factors: (1) a width of the power voltage wiring VCC100 in response to current capacity required for the functional circuit group FNBL1; (2) a width of the reference voltage wiring VSS100; and (3) the number of the internal wirings LH100 determined by circuit structure and layout of the functional circuit group FNBL1. Block widths FNBL2 through FNBLn are determined by the same factors as the above.

In the forgoing, as metal layers, there have been mentioned first metal layer M1L, second metal layer M2L, and third metal layer M3L. In addition to them, there is polysilicon (referred to as PolySi, hereinafter) layer as gate electrodes of the MOS transistors. That is, it is a four-layered wiring structure. There can be conceived of various processes to realize this four-layered wiring structure. FIG. 20 shows examples of possible processes. With process A, direct connections between adjacent layers are possible.

That is, a VIA contact Cvv connects third metal layer M3L and second metal layer M2L, a VIA contact Cv connects the second metal layer M2L and first metal layer M1L, and a contact Cp connects the first metal layer M1L and PolySi layer. On the contrary, with process B, ohmic contact between PolySi layer and first metal layer M1L is impossible. Accordingly, it is required that a contact Cpp should connect the PolySi layer and second metal layer M2L. Accordingly, designers must design layouts of functional circuit groups FNBL1 through FNBLn taking process factors such as the above into consideration.

FIG. 21 and FIG. 22 show structural differences of internal wirings LH100 derived from differences of manufacturing processes. FIG. 21 shows a layout diagram in case the process A is applied thereto whereas FIG. 22 shows a case that the process B is applied thereto. The both cases share common structural factors as follows: (1) a power voltage wiring VCC 100 is wired with second metal layer M2L and PMOS transistors are arranged immediately below of the power voltage wiring VCC; (2) a reference voltage wiring VSS100 is wired with the second metal layer M2L and NMOS transistors are arranged immediately below the reference voltage wiring VSS100; (3) the PMOS transistors and the NMOS transistors are connected with first metal layer M1L one to one, thereby to constitute CMOS units; and (4) the first metal layer M1L and the second metal layer M2L are wired crosswise. In FIG. 21, there is no need to use second metal layer M2L so as to connect PolySi layer and first metal layer M1L because the contact Cp can connect the PolySi layer and the first metal layer M1L directly. Accordingly, a wiring region width of an internal wiring LH100 is determined by an internal wiring region IL100 on which CMOS units are arranged in a row and an input/output wiring region IOL100 that constitutes three lines on which logic circuits or the like are arranged. On the other hand, in FIG. 22, the case of the process B, PolySi layer and first metal layer M1L cannot be connected to each other directly. Therefore, contacts Cpp connect the PolySi layer and second layer so as to connect the PolySi layer and the first metal layer M1L indirectly. Accordingly, it is necessary to place the second metal layer M2L as an alternate route for connecting the first metal layer M1L and the PolySi layer indirectly. Therefore, a wiring region width of the internal wiring LH100 is determined by: an internal wiring region IL100 on which CMOS units are arranged in a row; another internal wiring region IL100 for the PolySi layer that constitutes two lines; and an input/output wiring region IOL100 that constitutes three lines on which logic circuits or the like are arranged.

FIG. 23 shows an example of a functional circuit. This functional circuit FNB comprises four logic circuits, namely, CIR1, CIR2, CIR3, and CIR4. The logic circuits CIR1 through CIR4 are composed of: capacitance factors NCn (n=1, 2, . . . ) constituted by NMOS transistors; capacitance factors PCn (n=1, 2, . . . ) constituted by PMOS transistors; wiring layer switches SW1, SW2 for trimming; N-type diffused resistance units RSn (n=1, 2, . . . ) and the like. In detail, the NMOS transistors are constituted by inverter gates In (n=1, 2, . . . ), NAND gates Dn (n=1, 2, . . . ), NOR gates Rn (n=1, 2, . . . ), complex gates ND, NR (complex of NAND logic and NOR logic), and transfer gates Tn (n=1, 2, . . . ).

FIG. 24 shows a layout pattern of functional circuit directed to FIG. 23 laid-out in accordance with the process B shown in FIG. 20 and FIG. 22. From the left side of the layout pattern, there are arranged logic circuits CIR1, CIR2, CIR3, and CIR4, in order. Enlarged layout patterns of respective four logic circuits are shown in FIG. 25 through FIG. 28.

The layout pattern of FIG. 24 is structured such that PMOS transistors are arranged within a N-type well region NW100 and a region other than the N-type well region NW100 is taken as a P-type well region PW100 on which NMOS transistors are arranged facing to the PMOS transistors. On the PMOS transistors, there is wired a power voltage wiring VCC100 composed of second metal layer M2L thereby to supply power voltage VCC to the PMOS transistors. In a similar manner, on the NMOS transistors, there is wired a reference voltage wiring VSS100 composed of second metal layer M2L thereby to supply reference voltage VSS to the NMOS transistors. Between the power voltage wiring VCC100 and the reference voltage wiring VSS100, there are arranged two internal wiring regions IL100 for connecting internal wirings used for the logic circuits CIR1 through CIR4 and for internal connection wiring used in the functional circuits FNB. Between the two internal wiring regions IL100 there is further arranged an input/output wiring region IOL100 for supplying input/output wiring to the external of the functional circuit FNB.

Furthermore, as shown in FIG. 25 through FIG. 28, the N-type well region NW100 is biased with the power voltage VCC. The power voltage wiring VCC100 constituted by second metal layer M2L is connected to the N-type well region with the contacts Cd101 indirectly, i.e., via first metal layer M1L through contacts Cv101. Furthermore, the P-type well region PW100 is biased with the reference voltage VSS. The reference voltage wiring VSS100 constituted by second metal layer M2L is connected to the P-type well region with the contacts Cd101 indirectly, i.e., via first metal layer M1L through contacts Cv101.

The PMOS transistor consists of a source region and a drain region. More specifically, P-type diffused layer PSD100 constituting the PMOS transistor is divided into the source region and the drain region by gate electrodes constituted by PolySi layer. Power voltage VCC is supplied to the source region as follows. Firstly, power voltage VCC coming out from the power voltage wiring VCC100 constituted by second metal layer M2L is transmitted to first metal layer M1L via the contacts Cv101 and then, further transmitted to the source region via the contacts Cd102. Similar to the PMOS transistor, the NMOS transistor consists of a source region and a drain region. More specifically, N-type diffused layer NSD100 constituting the NMOS transistor is divided into the source region and the drain region by gate electrodes constituted by PolySi layer. Reference voltage VSS is supplied to the source region as follows. Firstly, reference voltage VSS coming out from the reference voltage wiring VSS100 constituted by second metal layer M2L is transmitted to first metal layer M1L via the contacts Cv101 and then, further transmitted to the source region via the contacts Cd102. The drain region of the PMOS transistor and that of the NMOS transistor are connected via the first metal layer M1L and the contacts Cd103.

Out of the logic circuits CIR1 through CIR4 constituting the functional circuit FNB directed to FIG. 23, typical parts depicted in the layout pattern diagram of these logic circuits will be described by referring to FIGS. 25 through 28.

Firstly, the circuit structures of the CMOS units D1 through 14 for the logic circuit CIR1 will be described by referring to FIG. 25, the layout pattern of it. There are wired input wirings A, B, and C constituted by first metal layer M1L crosswise with second metal layer M2L, like running through rows of PMOS/NMOS transistors. The input wirings A, B, and C are laid out such that data can be inputted to the input wirings from whichever of the PMOS/NMOS transistors for the function circuit FNB. These input wirings A, B, and C are connected to the second metal layer M2L via the contacts Cv102 and from there is further connected to each gate terminal of the NAND gate D1 as a CMOS unit via contacts Cpp101. Drain terminals of the PMOS transistors and those of the NMOS transistors, constituting the NAND gate D1, are made conductive to each other by connecting the drain terminals to the first metal layer M1L via the contacts Cd103. Source terminals of respective transistors are connected to the power voltage wiring VCC100 or the reference voltage wiring VSS100 both of which are constituted by the second metal layer M2L in directly, i.e., by way of the contacts Cd102, the first metal layer M1L and the contacts Cv101, similar to connection for the well regions PW and NW.

An output wiring of the NAND gate D1 is drawn from the first metal layer M1L connected to the second metal layer M2L via contacts CV103, and finally connected to a gate terminal, namely, an input terminal of the inverter gate I1, via the contacts CPP102. Source terminals of respective transistors for the inverter gate I1 are connected in the same manner as the NAND gate D1. Similar to the NAND gate D1, a drain terminal is connected to other one via contacts Cd104 and the first metal wire M1L, thereby to constitute an output wiring. Subsequent inverter gates I2 through I4 are connected in the same manner as the inverter gate I1. An output wiring of the inverter gate I4 corresponds to an output wiring OUT1 for the functional circuit FNB. Accordingly, an output from the inverter gate I4 is transmitted to the second metal layer M2L in the input/output wiring region IOL100 from the first metal layer M1L via the contacts Cv104 and finally delivered to the external of the functional circuit FNB. Since other logic circuits for CMOS units such as NOR gate and complex logic are connected with the same wiring structure, therefore descriptions of the other logic circuits will be omitted.

Next, a switch unit SW1, a CMOS unit of the logic circuit CIR2, will be described by referring to FIG. 26, the layout pattern of it. The switch unit SW1 is structured such that the switch unit SW1 can decide connection/disconnection between the ends a-b by switching wiring layer masks. This structure is used in case circuit structure and circuit parameter are changed depending on form. Details of the structure will be described by referring the layout pattern of FIG. 26. The connection between the ends a and b has been connected with a certain wiring layer number that is different from its original wiring layer number at the time of layout design. When a wiring layer mask is formed, connection condition on the mask is switched, which depends on whether data with the different wiring layer number is synthesized or not. In FIG. 26, the connection between the ends a and b is conducted on the second metal layer M2L.

Further on, a capacitance unit CP1 as a CMOS unit of the logic circuit CIR3 and a diffused resistance unit RS1 will be described by referring to FIG. 27, the layout pattern of it. The capacitance unit CP1 comprises: capacitance factors PC1 through PC3 constituted by PMOS transistors; capacitance factors NC1 through NC3 constituted by NMOS transistors; and a switch unit SW2 for trimming. These portions will be described by referring to the layout pattern of FIG. 27. In the PMOS capacitance factor PC1, source/drain terminals of the PMOS transistors are connected to the power voltage wiring VCC100, thereby to constitute MOS capacitor between their gate terminals. Similar to the PMOS capacitance factor PC1, in the NMOS capacitance factor NC1, source/drain terminals of the NMOS transistors are connected to the reference voltage wiring VSS100, thereby to constitute MOS capacitor between their gate terminals. For gate terminals of each transistor, the switch unit SW2 for trimming is designed to switch area of gate terminal that contributes as capacitor.

Furthermore, in FIG. 27, the diffused resistance unit RS1 is constituted by using N-type diffused layer. The diffused resistance unit RS1 has a curved shape curving between a connection point c with an output wiring of the inverter gate I12 and a connection point d with the capacitance unit CP2.

There are seven output wirings OUT1 through OUT7 in the functional circuit FNB. As apparent from FIG. 24 through FIG. 28, a wiring region of the input/output wiring region IOL100 is determined a wired area constituted with the second metal layer M2L that is a center area sandwiched by rows of PMOS transistors immediately below the power voltage wiring VCC100 and rows of NMOS transistors immediately below the reference voltage wiring VSS100 in the layout patterns. On both sides of the wiring area, there are wired connection wirings in the functional circuit FNB, thereby to constitute an internal wiring regions IL100. Furthermore, widths of the power voltage wiring VCC100 and the reference voltage VSS100 are determined by power capacity required for circuit structuring of the functional circuit FNB. Along with that, widths of respective various wirings in a layout pattern of the functional circuit FNB are secondarily determined by: width of the input/output wiring region IOL100; that of internal wiring regions IL100, that of the power voltage wiring VCC100; that of the reference voltage wiring VSS100; or wiring width. More specifically, layout width is determined by a maximum area portion of the internal wiring region IL100 that differ depending on position to be laid-out. In this example, there are connected the most number of the internal wirings at the portion occupied by R2 through R5 of the logic circuits CIR2 whereby wiring width is determined. Accordingly, the layout patterns of the functional circuit FNB need to take wiring region width of the internal wiring LH100 so that wiring of the logic circuit CIR2 can be done. Wiring width is not necessary for the other logic circuits CIR1, CIR3, and CIR4. However, in order to arrange the logic circuits CIR1 through CIR4, wiring position of the power voltage wiring VCC100 and that of the reference voltage wiring VSS 100 must coincide with each other. Especially, even for the logic circuits CIR1, CIR3, and CIR4 that do not require width for internal wiring, a maximum width required for the logic circuit CIR2 must be secured.

As described in the above, in the layout patterns of the functional circuit FNB, the internal wiring region IL100 must be taken such that internal connection wiring can be laid-out at a region where the number of connection wirings to be connected among the logic circuits CIR1 through CIR4 is maximized. Accordingly, even if the number of internal wirings is a few at a portion other than the region where the number of internal wirings is a maxim, the above-mentioned internal wiring regions IL100 are secured. Portions remaining even after necessary internal wirings are wired are left as blanks. Taking destination of semiconductor integrated circuit device developments into consideration, it is clear that higher functions and lager scale design will be required for functional circuits FNB and along with that, the number of internal connection wirings will increase. Furthermore, as larger scale and more complicated circuit structure are endeavored, the number of connection stages of functional circuit groups, arranged with multi-stage structure in layout patterning, becomes larger. Therefore, there will be arranged the significant number of various logic circuits on a row of functional circuit group. As a result, there will co-exit logic circuits that need large number of internal connection wirings and those that need a few number of internal connection wirings. Therefore, large scale of internal wiring region IL100 must be taken for logic circuits of larger number of internal connection wirings whereas large scale of non-wiring region must be taken within the internal wiring region IL100. Due to this, in layout patterning of functional circuit group, it is hard to enhance layout efficiency of the region between the power voltage wiring VCC100 and the reference voltage wiring VSS100, which prevents higher integration design of semiconductor integrated circuit devices.

What is more, as higher function and larger scale design of functional circuit is achieved and layout pattern to arrange functional circuits in a row with multi-staged structure becomes popular, there will be accompanied with regions that need large number of internal connection wiring in the layout pattern. As a result, the number input/output wirings to the functional circuit group will increase, as well. Therefore, it is necessary to set wide widths for the internal wiring region IL100 and input/output wiring region IOL100. As a result, the distance between a PMOS transistor and an NMOS transistor facing to each other over the internal wiring region IL100 and the input/output wiring region IOL100 becomes longer and parasitic resistance of connection wirings and parasitic element component of parasitic capacity become larger. That is, since the PMOS transistors and the NMOS transistors are connected to each other to constitute a CMOS unit for a logic circuit, such parasitic element component is added thereto. As a result, signal waveform has a delay and the like that deteriorates characteristics of the signal waveform. More specifically, there is aroused a problem such that operation time difference occurs between the PMOS transistor and the NMOS transistor whereby through current occurs when transistors are switched.

Furthermore, as widths of the internal wiring region IL100 and the input/output wiring region IOL100 are wider, area for N-type well region NW100 and that for P-type well region PW100 are larger. It should be noted that, in a layout patterning, usage frequency of contact Cd101 and the like for applying voltage bias to the both types of well regions does not increase in proportion to increase of the wiring region. Contrarily, as the number of internal connection wirings and input/output wirings increases, it becomes difficult to secure arrangement regions of the contact Cd101 and the like, whereby usage frequency of the contact Cd101 and the like decreases in inverse proportion to the increase of the wirings. Therefore, there occurs a fear that the well regions NW100 and PW 100 cannot be biased and their well potentials become unstable. This may possibly cause the functional circuit groups to degrade latch-up resistance and to fluctuate characteristics due to fluctuation of back-bias effect in the PMOS/NMOS transistors, which is obstacle for stable operation of semiconductor integrated circuit devices.

When starting layout design, a designer considers wiring connections regarding logic circuits and arrangement order on the layout. Furthermore, considering arrangement order of functional circuit groups, the designer assumes the number of internal connection wirings and input/output wirings and staging manner of the wirings. Based on the above layout factors, the designer estimates a space between the power voltage wiring VCC100 and the reference voltage wiring VSS100 and starts wiring layout of power voltage VCC and reference voltage VSS on a chip. However, it is difficult to accurately estimate spacing at the initial stage of layout design and calculate spaces for the internal wiring region IL100 and the input/output wiring region IOL100.

Especially in case progress of higher function and larger scale is achieved for functional circuits, accurate estimation of spacing may be impossible, which is problematic.

There may be a case such that, due to change of circuit design, internal connection wiring and input/output wiring and the like need to be added on the layout after wiring manners of the power voltage VCC and the reference voltage VSS are determined. In this case, the designer need to reconsider the number of the internal connection wirings and input/output wirings and staging manner of the wirings and estimate the space between the power voltage wiring VCC100 and the reference voltage wiring VSS100 again so as to secure a wiring region for the newly added wirings. On design work of semiconductor integrated circuit device field wherein speed-up of design span is required, there may be a case that layout design and circuit design are conducted in parallel and redesign of layout due to change of circuit design makes development time long.

Furthermore, in manufacturing process of semiconductor integrated circuit, there may be a case that wiring structure or the like of multi-layered wiring must be changed due to factors such as modification of device characteristics and change of manufacturing condition. For example, there may be changes of connection relationship, which depends on a factor whether or not ohmic contact to PolySi layer, shown in FIG. 20 through FIG. 22, is possible. In this case, a semiconductor integrated circuit device released with process A must be realized with process B. In process A, the first metal layer M1L and PolySi layer are connected to each other directly whereas in process B, the first metal layer M1L and PolySi layer are connected indirectly, i.e., via the second metal layer M2L. Therefore, in process B, it is necessary to secure a region for wiring the second metal layer M2L. In case making-up a layout library of process B from that of process A, it is necessary to change wirings of the power voltage VCC and the reference voltage VSS, which takes a long time to make-up a new layout library.

SUMMARY OF THE INVENTION

The present invention, attempted to resolve the above-noted problems with the prior art, relates to layout patterns of a semiconductor integrated circuit device wherein there are arranged functional circuit groups in one direction on a chip so as to enhance layout efficiency and prevent deterioration of element characteristics.

In order to achieve the above-stated object, a semiconductor integrated circuit device according to first aspect of the invention comprises: a pair of a first power wiring and a second power wiring, the pair being arranged in one direction, wherein a first region between the first power wiring and the second power wiring; fundamental circuit units constituted by combining one or more PMOS transistors and one or more NMOS transistors, the fundamental circuit units being arranged along with the first power wiring and the second power wiring; logic circuit units constituted by a plurality of the fundamental circuit units; functional circuit units constituted by a plurality of the logic circuit units, the functional circuit units being arranged in a manner of multi-staged structure; wherein at least one part of the PMOS transistors and that of the NMOS transistors are arranged below the first power wiring and the second power wiring; and unit connection wirings to connect between the fundamental circuit units or to connect between the logic circuit units, of which terminals terminate at the functional circuit units are arranged on second regions that are other than the first region, in case the unit connection wirings are constituted by a layer that is same as a wiring layer that constitutes the first power wiring and the second power wiring or by wiring layers that are under the wiring layer of the first and second power wirings.

In the semiconductor integrated circuit device according to the one aspect of the present invention, there are appropriately arranged functional circuit units in a manner of multi-staged structure along with a pair of the first power wiring and the second power wiring that form the first region between there. PMOS transistors and NMOS transistors constitute functional circuit units and at least one part of the PMOS transistor and that of the NMOS transistor are arranged below the first power wiring and the second power wiring. Connection wirings to be wired between the fundamental circuit units wired in the functional circuit units or between the logic circuit units are arranged on the second regions that are other than the first region. More specifically, the connection wirings are constituted by a layer the same as the wiring layer constituting the first and second power wirings or by layers under the wiring layer of the first and second power wirings Therefore, no unit connection wirings are arranged on the first region. Accordingly, a wiring layout pattern does not leave any empty portions caused by connection between the fundamental circuit units. Furthermore, the first region can be used as an input/output wiring region wired running through the functional circuit units. Accordingly, layout efficiency of the first region can be thus enhanced and higher integration design of semiconductor integrated circuit device can be realized.

The above and the further objects and novel features of the invention will more fully appear from following detailed description when the same is read in connection with the accompanying drawings. It is to expressly understood, however, that the drawings are for the purpose of illustration only and are not intended as a definition of the limits of the invention.

BRIEF DESCRIPTION OF THE DRAWINGS

The accompanying drawings, which are incorporated in and constitute a part of this specification illustrate an embodiment of the invention and, together with the description, serve to explain the objects, advantages and principles of the invention.

In the drawings,

FIG. 5 shows relationship between unit wiring region and layout of NAND gate (Fifth Embodiment);

FIG. 6 shows relationship between unit wiring region and layout of NOR gate (Sixth Embodiment);

FIG. 27 shows a layout pattern of a logic circuit CIR3 directed to prior art; and FIG. 28 shows a layout pattern of a logic circuit CIR4 directed to prior art.

DETAILED DESCRIPTION OF THE PREFERRED EMBODIMENTS

First through Seventh Embodiments regarding the inventive semiconductor integrated circuit device will be described by referring to FIG. 1 through FIG. 17.

Figure 1:
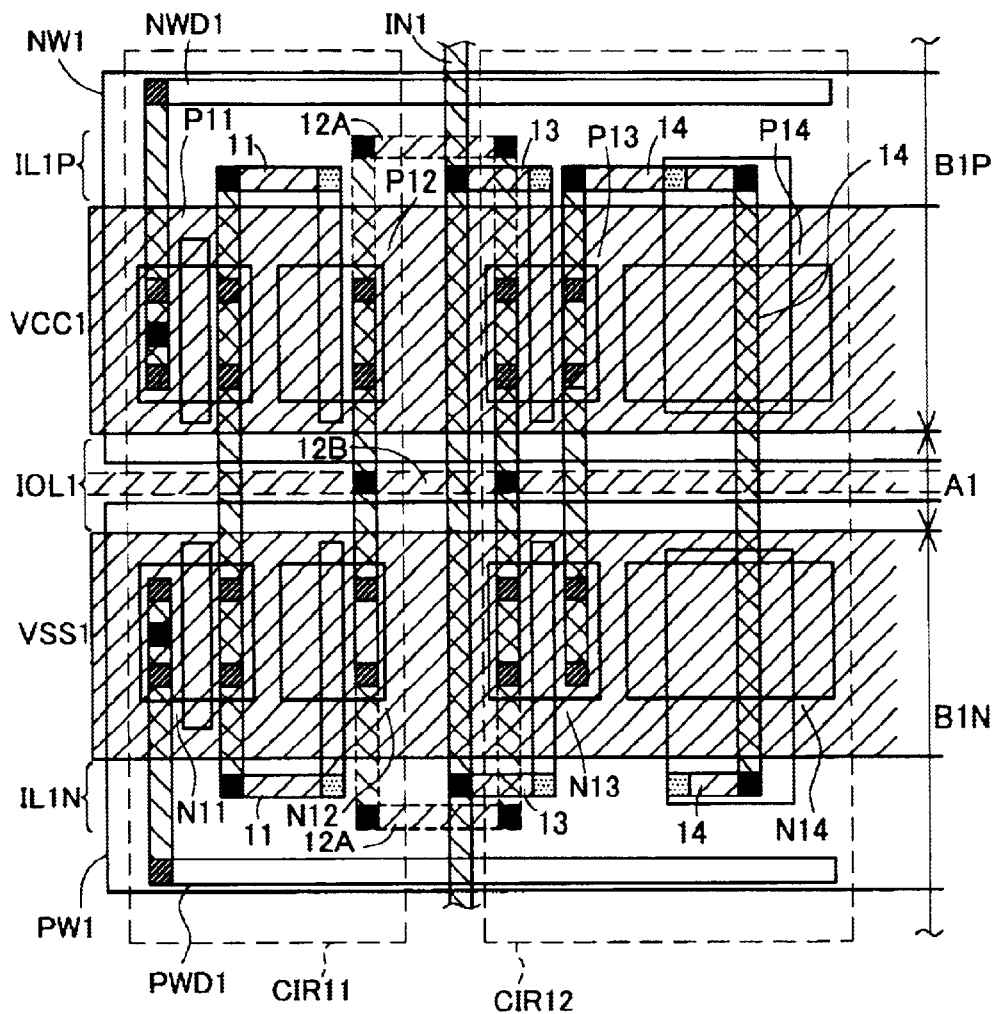
FIG. 1 is a layout diagram directed to First Embodiment.
Figure 22:
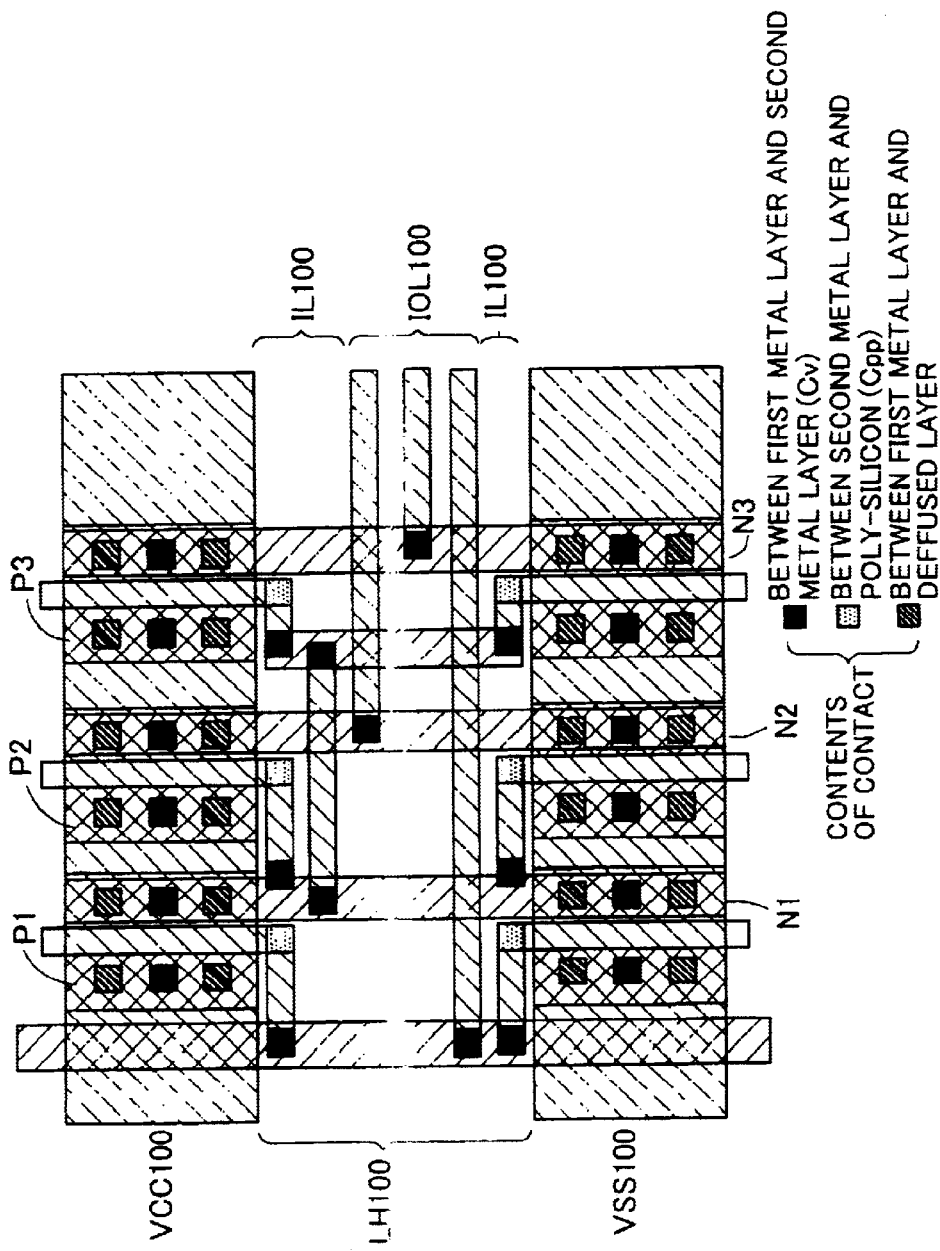
FIG. 22 is a layout diagram in case process B directed to FIG. 20 is applied.

FIG. 1 is a layout diagram directed to a First Embodiment, more specifically, a layout diagram in accordance with process B. Instead of the internal wiring regions IL100 shown in FIG. 22, in the First Embodiment, a unit wiring region IL1P is constituted outside of a power voltage wiring VCC1, a part of a second region B1P and a unit wiring region IL1N is constituted outside of a reference voltage wiring VSS1, a part of a second region B1N. Within the second wiring regions B1P and B1N, connection wirings 11, 12A, 13, 14 are wired. These connection wirings connect between CMOS units (P11–N11) through (P14–N14) that constitute logic circuits CIR11 and CIR12 or between the logic circuits CIR11 and CIR12.

In the First Embodiment, PMOS transistors P11 through P14 are arranged within an N-type well region NW1 and this layer is coated with the power voltage wiring VCC1 made of second metal layer M2L. Furthermore, NMOS transistors N11 through N14 are arranged within a P-type well region PW1 and this layer is coated with the reference voltage wiring VSS1 made of second metal layer M2L. The structure such as above is identical to layout patterns of prior art shown in FIG. 22, FIG. 24 through FIG. 28.

Input/output wirings to the functional circuit are located in a first region A1 that is laid-out between the second regions B1P and B1N, thereby to constitute an input/output wiring region IOL1. After diffused regions NWD1 and PWD1 for ohmic contact arranged outside of the unit wiring regions IL1P and IL1N are made conductive to the first metal layer M1L via the power voltage wiring VCC1 and the reference voltage wiring region VSS1, both made of second metal layer M2L, and contacts Cv, bias is applied to the N-type well region NW1 and the P-type well region PW1 via the first metal layer M1L and contacts Cd.

Since the layout pattern of the First Embodiment is made in accordance with process B, connection to a gate terminal of the CMOS unit starts from the second metal layer M2L. Since both the power voltage wiring VCC1 and the reference voltage wiring VSS1 correspond to the second metal layer 2ML, the unit wiring regions IL1P and IL1N are arranged outside of the power voltage wiring VCC1 and the reference voltage wiring VSS1 that are parts of the second regions B1P and B1N, respectively. Furthermore, there is shown a wiring 12B within the input/output wiring region IOL1, a substitute for unit wirings 12A. The wiring 12B works out in case signals to be transmitted between the CMOS units (P12–N12) and (P13–N13) are input/output signals for the functional circuit. That is, the wiring 12B is provided for the case that wiring for the input/output signals is arranged on the input/output wiring region IOL1.

In FIG. 1, the unit wiring regions IL1P and IL1N are arranged outside of the power voltage wiring VCC1 and the reference voltage wiring VSS1 both of which occupy parts of the second regions B1P and B1N, respectively. In the first region A1, there is only arranged the input/output wiring region IOL1. Input/output wirings to be arranged on the input/output wiring region IOL1 extend to both ends of the functional circuit. Therefore, a wiring layout with an empty portion in the first region A1 is inconceivable.

Furthermore, the first region A1 is determined by a space depending on device specification regarding PMOS/NMOS transistors, N-/P-type well regions NW1 and PW1 and the like or a width depending on the number of input/output wirings to be arranged on the input/output wiring region IOL1, whichever is longer. However, since no unit wiring region is arranged in the first region A1, different from the prior art, the width of the first region A1 is taken short. Accordingly, a wiring length of the first metal layer M1L for connecting the PMOS/NMOS transistors is short. Furthermore, an area of the N-type well region NW1 on which the PMOS transistors are arranged and that of the P-type well region PW1 on which the NMOS transistors are arranged are made small.

In case changes are made to the connection wirings 11, 12A, 13, 14 for connecting between the CMOS units (P11–N11) through (P14–N14) or between the logic circuits CIR11 and CIR12, structural adjustments are made to the unit wiring regions IL1P, a part of the second region B1P, and IL1N, a part of the second region B1N.

According to the layout diagram directed to the First Embodiment, there is only arranged the input/output wiring region IOL1 in the first region A1. Since input/output wirings arranged in the input/output wiring region IOL1 extend to the both ends of the functional circuit, a wiring layout with an empty portion in the first region A1 is not conceived. Accordingly, layout efficiency at the first region A1 can be enhanced and higher integration design of semiconductor integrated circuit device can be realized.

Furthermore, the first region A1 is determined by either a space predetermined by device specifications of PMOS/NMOS transistors and N-type/P-type well regions NW1, PW1 and the like or a length depending on the number of input/output wirings to be arranged on the input/output wiring region IOL1, whichever is longer. Since there is no need to secure unit wiring regions IL1P and IL1N, entire width of the layout can be taken shorter than cases of prior art. Accordingly, wiring length of the first metal layer M1L to connect PMOS/NMOS transistors can be shortened. Thereby, parasitic resistance, parasitic capacitance and the like due to the wirings can be minimized and characteristic deterioration such as through current caused by transmission delay of signals can be prevented at the CMOS unit constituted by connecting PMOS/NMOS transistors.

Furthermore, since areas of N-type well region NW1 and P-type well region PW1 on which PMOS transistors and NMOS transistors are arranged, respectively, can be lessened. Therefore, N-type well region NW1 and P-type well region PW1 can be biased surely with less frequent arrangements of contacts for the power voltage wiring VCC1 or the reference voltage wiring VSS1. Accordingly, latch-up resistance can be kept as well as back gate bias effect of PMOS/NMOS transistors can be kept constant so that characteristic deterioration of the transistors can be avoided.

Furthermore, since unit wiring regions IL1P and IL1N that is likely to be fluctuation factors of layout-pattern width of functional circuit layout, can be arranged outside of the power voltage wiring VCC1 and the reference voltage wiring VSS1, the first region A1 can be used for the input/output region IOL1 only. Spacing of the input/output wiring region IOL1 can be easily estimated from a circuit diagram at initial stage of its layout design. Therefore, positions of the power voltage wiring VCC1 and the reference voltage wiring VSS1 can be estimated accurately. Thereby, there will not be brought a need to re-estimate positioning between the power voltage wiring VCC1 and the reference voltage wiring VSS1 in the course of layout design. In case the circuit design is changed after positioning of the power voltage wiring VCC1 and the reference voltage wiring VSS1 is determined, design change of the unit wiring regions IL1P, IL1N can compensate the entire circuit design. That is, it is not necessary to change the positioning of the power voltage wiring VCC1 and the reference voltage wiring VSS1. Therefore, this layout design is preferable to lessen the number of layout design process.

Figure 2:
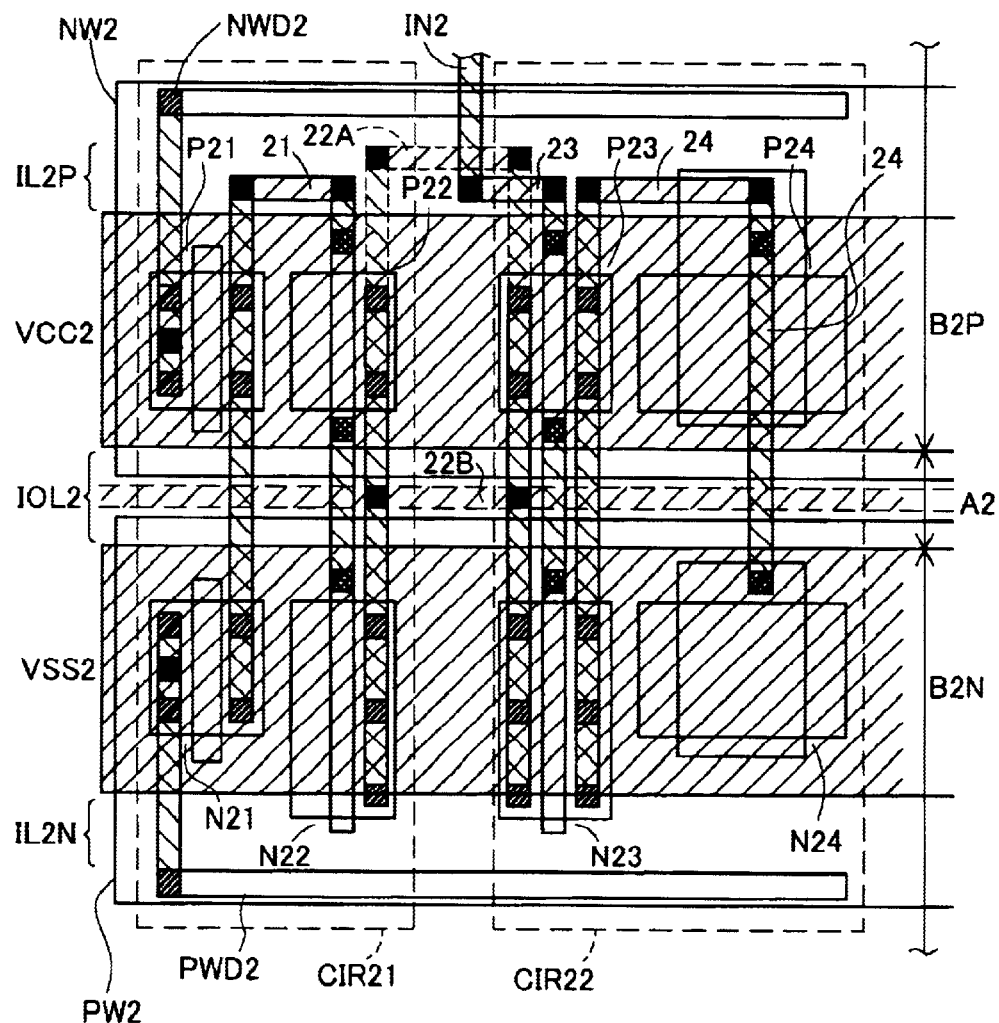
FIG. 2 is a layout diagram directed to Second Embodiment.
Figure 21:
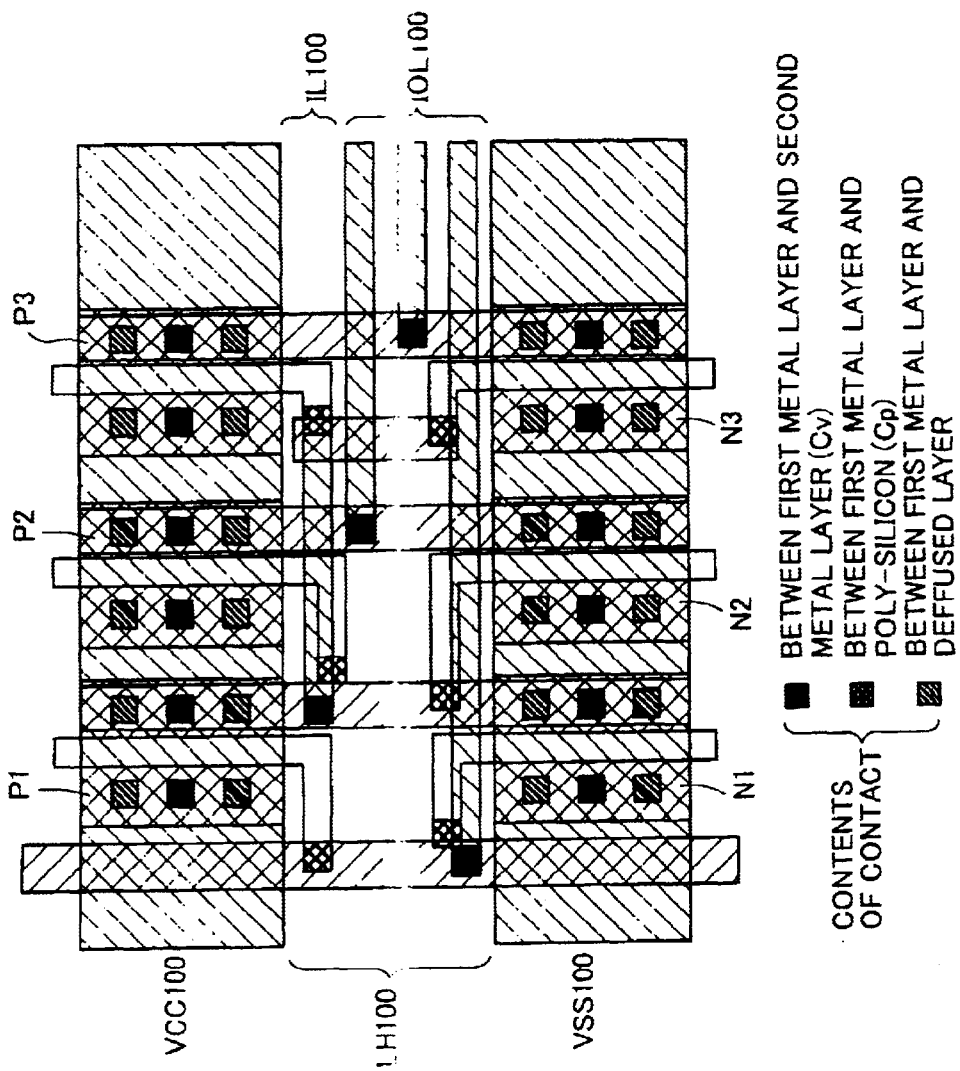
FIG. 21 is a layout diagram in case process A directed to FIG. 20 is applied.

FIG. 2 is a layout diagram directed to a Second Embodiment, more specifically, a layout diagram in accordance with process A. Instead of the internal wiring region IL100 shown in FIG. 21, in the Second Embodiment, a unit wiring region IL2P is constituted outside of a power voltage wiring VCC2, a part of a second region B2P. Within the second region B2P, connection wirings 21, 22A, 23, 24 are wired. These connection wirings connect between CMOS units (P21–N21) through (P24–N24) that constitute logic circuits CIR21 and CIR22 or between the logic circuits CIR21 and CIR22. Different from the First Embodiment, in the Second Embodiment, there is constituted the unit wiring region IL2P only on the second region B2P at the side of the power voltage wiring VCC2. Not to mention, a unit wiring region can be arranged on a second region B2N at the side of the reference voltage wiring VSS2, instead of the second region B2P.

In the Second Embodiment, the following points are similar to the layout pattern of the First Embodiment: (1) relationship between the PMOS transistors P21 through P24 and the N-type well region NW2 or the power voltage wiring VCC2; (2) relationship between the NMOS transistors N21 through N24 and P-type well region PW2 or the reference voltage wiring VSS2; (3) structure of an input/output wiring region IOL2 wherein input/output wirings to the functional circuit are arranged on the first region A2; (4) bias-application system wherein bias is applied to the N-type well region NW2 and P-type well region PW2 via a diffused region NWD2 for ohmic contact arranged outside of the unit wiring region IL2P; and (5) relationship between the unit wiring 22A and wiring 22B in the input/output wiring region IOL2.

Since the layout pattern of the Second Embodiment is made in accordance with process A, connection to a gate terminal of the CMOS unit starts from the first metal layer M1L.

The layout pattern of the Second Embodiment differs from that of the First Embodiment in terms of a point that the unit wiring region IL2P is placed at the side of the power voltage wiring VCC2. However, in terms of fundamental function, the Second Embodiment is the same as the First Embodiment. In the Second Embodiment, a unit wiring region IL2N is not arranged on the second region B2N. Therefore, unit connection wirings do not exit thereon.

According to the layout diagram directed to the Second Embodiment, the unit wiring region IL2P exists only at the side of the power voltage wiring VCC2, which differs from the layout pattern of the First Embodiment. However, fundamental effects of this Embodiment are similar to those of the First Embodiment.

Furthermore, in the Second Embodiment, a unit wiring region IL2N does not exit outside of the reference voltage wiring VSS2 that is a part of the second region B2N so no unit connection wiring exits. Therefore, this open region can be allocated for other element region such as diffused resistance not shown, which significantly contributes to higher integration design of a semiconductor integrated circuit device.

Furthermore, the PMOS transistors P21 through P24 arranged at the side of the power voltage wiring VCC2 on the unit wiring region IL2P are included below the power voltage wiring VCC2. Accordingly, it never occurs that the PMOS transistors P21 through P24 are arranged outside of the unit wiring region IL2P and make the unit connection wirings in the unit wiring region IL2P narrow. Accordingly, layout efficiency of the unit connection wirings can be enhanced.

Although the Second Embodiment describes a case that the unit wiring region IL2P is arranged only at the side of the power voltage wiring VCC2, a unit wiring region IL2N can be arranged at the side of the reference voltage wiring VSS2. In this case, both the unit wiring regions IL2P and IL2N can be directly connected to the PMOS transistors and NMOS transistors, which is convenient.

Figure 3:
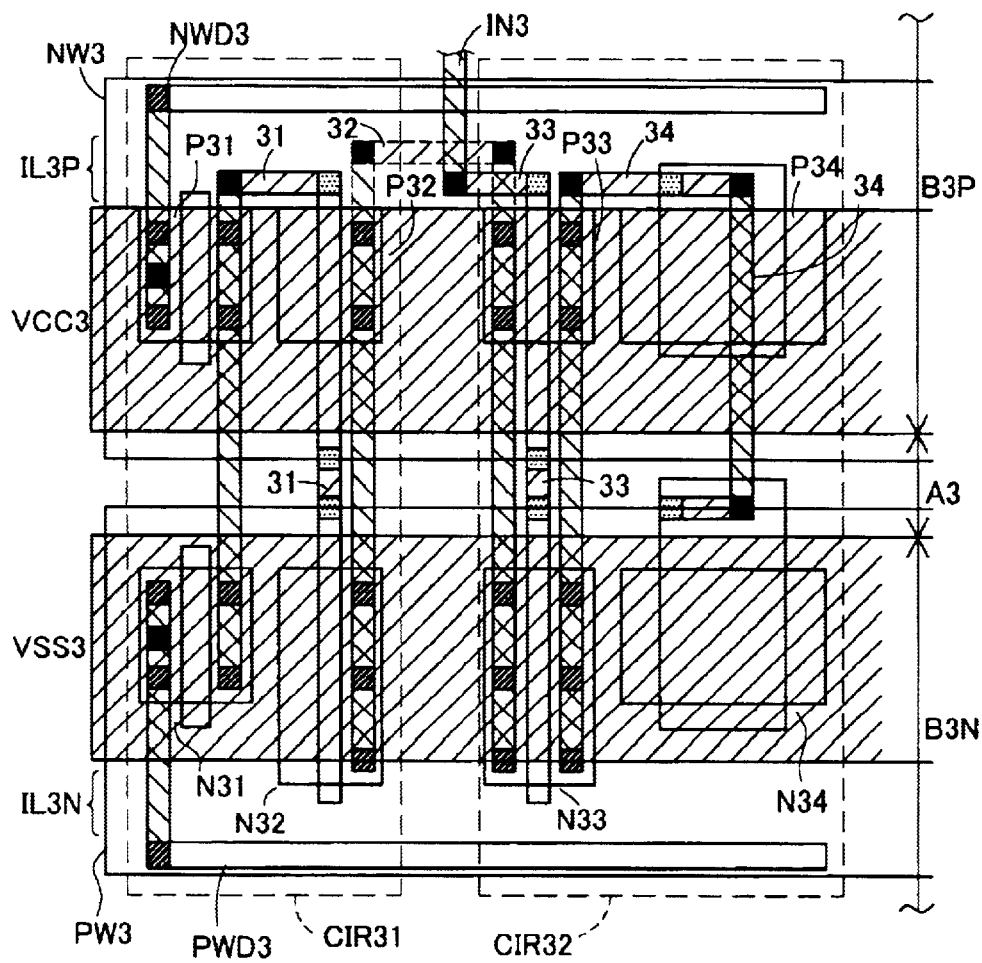
FIG. 3 is a layout diagram directed to Third Embodiment.

FIG. 3 is a layout diagram directed to a Third Embodiment. More specifically, FIG. 3 corresponds to a general layout diagram of the Second Embodiment wherein process B is adopted. Furthermore, the Third Embodiment is structured such that outer edge of PMOS transistors P31 through P34 are aligned with the outer edge of a power voltage wiring VCC3, instead of the PMOS transistors P21 through P24 directed to the Second Embodiment. The gate terminals of the PMOS transistors and those of the NMOS transistors are connected to one another via second metal layer M2L so that the structure of the unit wiring region IL2P directed to the Second Embodiment can be applied to process B. In this case, different from the original wiring direction, the second metal layer M2L is arranged in the same direction as the first metal layer M1L. Since this second metal layer M2L and a first region A3 are arranged crosswise, an input/output wiring region IOL3 is not constituted on the first region A3 but arranged outside of a reference voltage wiring VSS3, which is not shown. Instead of the circuit structure shown in FIG. 3, the Third Embodiment can be laid-out such that an input/output wiring region IOL3 is arranged on the second region B3P and a unit wiring region IL3N is arranged on the second region B3N.

In the Third Embodiment, the following points are similar to the layout pattern of the Second Embodiment: (1) relationship between PMOS transistors P31 through P34 and an N-type well region NW3; (2) relationship between NMOS transistors N31 through N34 and a P-type well region PW3; and (3) bias-application system wherein bias is applied to the N-type well region NW3 and P-type well region PW3 via diffused regions NWD3 and PWD3 for ohmic contact.

Since the layout pattern of the Third Embodiment is made in accordance with process B, connection to a gate terminal of the CMOS unit must be routed through the second metal layer M2L. Accordingly, the layout pattern of the Third Embodiment is structured such that the second metal layer M2L for connecting gate terminals of the PMOS/NMOS transistors runs beside the first metal layer M1L crossing a first region A3.

The layout pattern of the Third Embodiment differs from that of the Second Embodiment in terms of a point that the unit wiring region IL3P exists only at the side of the power voltage wiring VCC3. Therefore, the input/output wiring region IOL3 can be arranged at the side of the reference voltage wiring VSS3. However, in terms of fundamental function, the Third Embodiment is the same as the Second Embodiment.

According to the layout diagram directed to the Third Embodiment, the unit wiring region IL3P exists only at the side of the power voltage wiring VCC3 and the input/output wiring region IOL3 exits at the side of the reference voltage wiring VSS3, which differs from the layout pattern of the Second Embodiment. However, fundamental effects of this Embodiment are similar to those of the Second Embodiment.

Furthermore, in the Third Embodiment, the outer edge of the PMOS transistors P31 through P34 are aligned with the outer edge of the power voltage wiring VCC3. Therefore, the PMOS transistors P31 through P34 are arranged without poking out to the unit wiring region IL3P whereby the unit wiring region IL3P will never be narrowed. Thereby, layout efficiency of the unit connection wirings can be enhanced. The circuit structure of the Third Embodiment is convenient to minimize the distance between the PMOS transistors P31 through P34 and unit connection wiring in the unit wiring region IL3P and restrain at minimum the parasitic resistance and parasitic capacitance at the first metal layer M1L that constitutes the unit connection wirings. This prevents operation characteristics of the CMOS unit from deteriorating.

The Third Embodiment describes a case that the outer edge of the PMOS transistors P31 through P34 are aligned with the outer edge of the power voltage wiring VCC3. On the contrary, even if the outer edge of the NMOS transistors N31 through N34 are aligned with the outer edge of the reference voltage wiring VSS3 and the unit wiring region IL3N is placed at the side of the reference voltage wiring VSS3, the NMOS transistors can receive interaction and effects the same as the PMOS transistors, not to mention.

Figure 4:
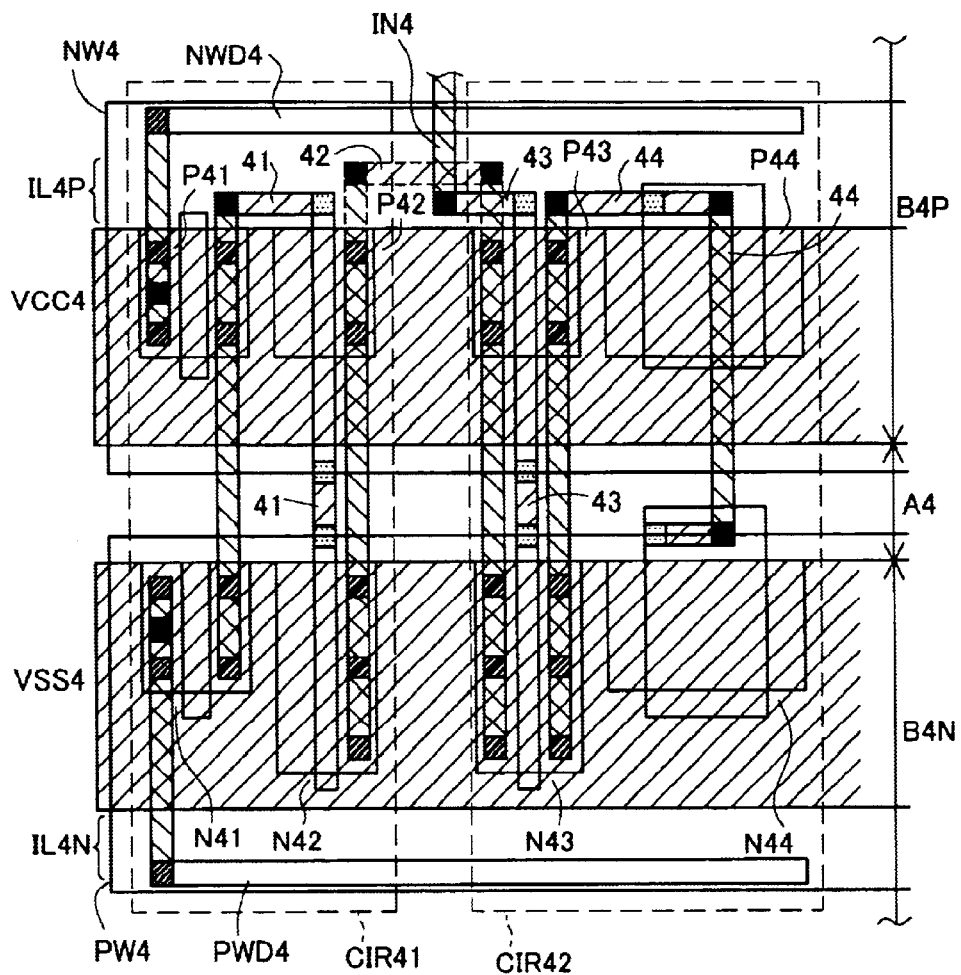
FIG. 4 is a layout diagram directed to Fourth Embodiment.

FIG. 4 is a layout diagram directed to a Fourth Embodiment. More specifically, the Fourth Embodiment corresponds to an incorporation of general layout diagram of the Third Embodiment shown in FIG. 3 and structure such that outer edge of PMOS transistors P41 through P44 are aligned with outer edge of a power voltage wiring VCC4 and inner edge of NMOS transistors N41 through N44 are aligned with inner edge of a reference voltage wiring VSS4. In the Fourth Embodiment, second metal layer M2L for connecting gate terminals of the PMOS/NMOS transistors runs beside the first metal layer M1L in a same direction, similar to the Third Embodiment. Accordingly, an input/output wiring region IOL4 is not formed on a first region A4 but is arranged outside (not shown) of the reference voltage wiring VSS4, which is the same as the Third Embodiment. The input/output wiring region IOL4 and a unit wiring region IL4N can be arranged in the second region B4P and the second region B4N, respectively.

In the Fourth Embodiment, the following points are similar to the layout pattern of the Third Embodiment: (1) relationship between the PMOS transistors P41 through P44 and the N-type well region NW4; (2) relationship between the NMOS transistors N41 through N44 and the P-type well region PW4; (3) bias-application system wherein bias is applied to the N-type well region NW4 and P-type well region PW4 via diffused regions NWD4 and PWD4 for ohmic contact; and (4) structure that the second metal layer M2L for connecting gate terminals of the PMOS/NMOS transistors runs beside the first metal layer M1L crossing the first region A4 because process B is adopted therein.

In the layout pattern of the Fourth Embodiment, an input/output wiring region IOL4 is not arranged in the first region A4, and the unit wiring region IL4P exists only at the outer edge side of the power voltage wiring VCC4. Therefore, the input/output wiring region IOL4 can be arranged outer side of the reference voltage wiring VSS4, which is similar to the Third Embodiment.

The layout diagram of the Fourth Embodiment are similar to that of the Third Embodiment in terms of the following points: (1) unit wiring region IL4P exists only at the outer edge of the power voltage wiring VCC4; (2) the input/output wiring region IOL4 is arranged outside of the reference voltage wiring VSS4; and (3) the outer edge of the PMOS transistors P41 through P44 are aligned with the outer edge of the power voltage wiring VCC4. Therefore, fundamental effects are similar to the Third Embodiment.

Furthermore, in the Fourth Embodiment, the inner edge of the NMOS transistors N41 through N44 are aligned with the inner edge of the reference voltage wiring VSS4. Additionally, the outer edge of the PMOS transistors P41 through P44 are aligned with the outer edge of the power voltage wiring VCC4. Thereby, a distance between the PMOS transistors P41 through P44 and the NMOS transistors N41 through N44 can be minimized, which is convenient to restrain at minimum the parasitic resistance and parasitic capacitance at connection wiring of the first metal layer M1L that constitutes the unit connection. Thereby, as for the CMOS unit, deterioration of operation characteristics can be avoided.

The Fourth Embodiment describes a case that the outer edge of the PMOS transistors P41 through P44 and the inner edge of the NMOS transistors N41 through N44 are aligned with the outer edge of the power voltage wiring VCC4 and the inner edge of the reference voltage wiring VSS4, respectively. Vice versa, even if the inner edge of the PMOS transistors and the outer edge of the NMOS transistors are aligned with the inner edge of the power voltage wiring VCC4 and the outer edge of the reference voltage wiring VSS4, respectively, same interaction and effects can be obtained, not to mention.

FIG. 5 directed to a Fifth Embodiment shows layout relationship between unit wiring regions IL1P, IL1N through IL4P and a NAND gate constituting a CMOS unit. FIG. 5 shows a circuit diagram of a NAND gate circuit that has n inputs. The NAND gate circuit is constituted by PMOS transistors MP1 through MPn (gate width: Wp) connected in parallel between an output terminal OUT and a power voltage wiring VCC5, and NMOS transistors MN1 through MNn (gate width: Wn) connected in serial between the output terminal OUT and a reference voltage wiring VSS5. Since mobility rate regarding P/N type majority carrier (hole/electron) for a semiconductor integrated circuit device is 1 (hole) to 2 (electron), a typical circuit of this type is designed such that rate of gate width regarding PMOS/NMOS transistors is set to 2 (PMOS) to 1 (NMOS) as current drive ability so as to make an output waveform of rising output node and that of falling output node same. Accordingly, the following relationships are derived from FIG. 5:

$Wp:Wn/n=2:1$ with other expression, $Wn=(n/2) \times Wp$ because the number of input terminals of the NAND gate circuit is 2 or more (n≧2), $Wn \geq Wp$ (when $n=2$, $Wn=Wp$)

The lower portion of FIG. 5 shows a layout diagram of the PMOS/NMOS transistors laid-out with four-input (n=4, Wn=2 Wp) manner. Here, let us take a case that gate terminals are laid-out without being folded when the PMOS transistors are regarded as reference. When gate width of the PMOS transistors is W, that of the NMOS transistors is 2W(Wn=2Wp=2W). When width 2W is shorter than width of the reference voltage wiring VSS5, it is not necessary to fold the gate terminals of the NMOS transistors. Thereby, the number of gates of the PMOS transistors and that of the NMOS transistors are the same and respective terminals of gate, source, and drain for the PMOS transistors and those for the NMOS transistors can be laid-out one to one facing to each other.

On the other hand, when gate width of the PMOS transistors is 2W, that of the PMOS transistors is 4W(Wn=2Wp=4W). When width 4W is longer than width of the reference wiring VSS5, it is necessary to fold the gate terminals of the NMOS transistors. FIG. 5 shows a layout wherein gate terminals are folded double. In this case, the number of gates for the NMOS transistors is double of the number of gates for the PMOS transistors.

According to the Fifth Embodiment, each gate width of the NAND gates satisfies expressions indicated in FIG. 5. Since gate width of the NMOS transistors is always longer than that of the PMOS transistors, it is apparent that the number of gates for the NMOS transistors will never be less than that of the PMOS transistors in case the NMOS/PMOS transistors are arranged meeting with width for a power voltage wiring VCC5 and that for a reference voltage wiring VSS5 both of which are previously set up. Accordingly, in case that a unit wiring region IL5P exists at the side of the power voltage wiring VCC5, the number of gates for the NMOS transistors and the number of gates for the PMOS transistors are to be made the same. Gates being so laid-out, connection wirings between the PMOS transistors and the NMOS transistors do not need to take a plurality of supplemental wirings for indirect connection. The PMOS/NMOS transistors can basically be connected with a wiring layer not folded.

Furthermore, in case that the unit wiring region IL5N exists at the side of the reference voltage wiring VSS5, even if there are laid-out larger number of NMOS transistor gates than PMOS transistor gates, connection wirings can connect the NMOS/PMOS transistors without using a plurality of wiring layers. Thereby, the PMOS/NMOS transistors can basically be connected with a wiring layer not folded.

Accordingly, there can be avoided problematic situations such that the first metal layer M1L and the second metal layer M2L are connected via contacts Cv because connection wirings are folded or a plurality of the second metal layer M2L interfere with one another at the portion where wirings are folded, whereby higher integration of connection wirings can be realized.

FIG. 6 directed to a Sixth Embodiment shows layout relationship between unit wiring regions IL1P, IL1N through IL4P and a NOR gate constituting a CMOS unit. FIG. 6 shows a circuit diagram of a NOR gate circuit that has m inputs. The NOR gate circuit is constituted by PMOS transistors MP1 through MPm (gate width: Wp) connected in serial between an output terminal OUT and a power voltage wiring VCC6, and NMOS transistors MN1 through MNm (gate width: Wn) connected in parallel between the output terminal OUT and a reference voltage wiring VSS6. Similar to the Fifth embodiment, mobility rate regarding majority carrier (electron/hole) is 2 (electron) to 1 (hole). Accordingly, rate of gate width regarding PMOS/NMOS transistors is set to 2 (PMOS) to 1 (NMOS). Therefore, the following relationships are derived from FIG. 6:

$$Wp/m:Wn=2:1$$

with other expression, $$Wp=2m \times Wn$$

Because the number of input terminals of the NOR gate circuit is 2 or more (m≧2), $$Wp \geq 4Wn \text{(when } m=2, Wp=4Wn\text{)}$$

The lower portion of FIG. 6 shows a layout diagram of the PMOS/NMOS transistors laid-out with two-input (m=2, Wp=4Wn). Here, let us take a case that gate terminals are laid-out without being folded when the NMOS transistors are regarded as reference. When gate width of the NMOS transistors is W, that of the PMOS transistors is 4W (Wp=4Wn=4W). When width 4W is shorter than width of the power voltage wiring VCC6, it is not necessary to fold the gate terminals of the PMOS transistors. Thereby, the number of gates of the NMOS transistors and that of the PMOS transistors are the same and respective terminals of gate, source, and drain for the NMOS transistors and those for the PMOS transistors can be laid-out one to one facing to each other.

On the other hand, the width of 4W is longer than width of the power voltage wiring VCC6, it is necessary to fold the gate terminals of PMOS transistors. FIG. 6 shows a layout wherein gate terminals are folded double. In this case, the number of gates for the PMOS transistors is double of the number of gates for the NMOS transistors.

According to the Sixth Embodiment, each gate width of the NOR gates satisfies expressions indicated in FIG. 6. Since gate width of the PMOS transistors is always longer than that of the NMOS transistors, it is apparent that the number of gates for the PMOS transistors will never be less than that of the NMOS transistors in case the PMOS/NMOS transistors are arranged meeting with width for a power voltage wiring VCC6 and that for a reference voltage wiring VSS6 both of which are previously set up. Accordingly, in case that a unit wiring region IL6N exists at the side of the reference voltage wiring VSS6, the number of gates for the PMOS transistors and the number of gates for the NMOS transistors are to be made the same. Gate being so laid-out, connection wirings between the PMOS transistors and the NMOS transistors do not need to take a plurality of supplemental wirings for indirect connection. The PMOS/NMOS transistors can basically be connected with a wiring layer not folded.

Furthermore, in case that the unit wiring region IL6P exists at the side of the power voltage wiring VCC6, even if there are laid-out larger number of PMOS transistor gates than NMOS transistor gates, connection wirings can connect the PMOS/NMOS transistors without using a plurality of wiring layer. Thereby, the PMOS/NMOS transistors can basically be connected with a wiring layer not folded.

Accordingly, there can be avoided problematic situations such that the first metal layer M1L and the second metal layer M2L are connected via contacts Cv because connection wirings are folded or a plurality of the second metal layer M2L interfere with one another at the portion where wirings are folded, whereby higher integration of connection wirings can be realized.

Figure 7:
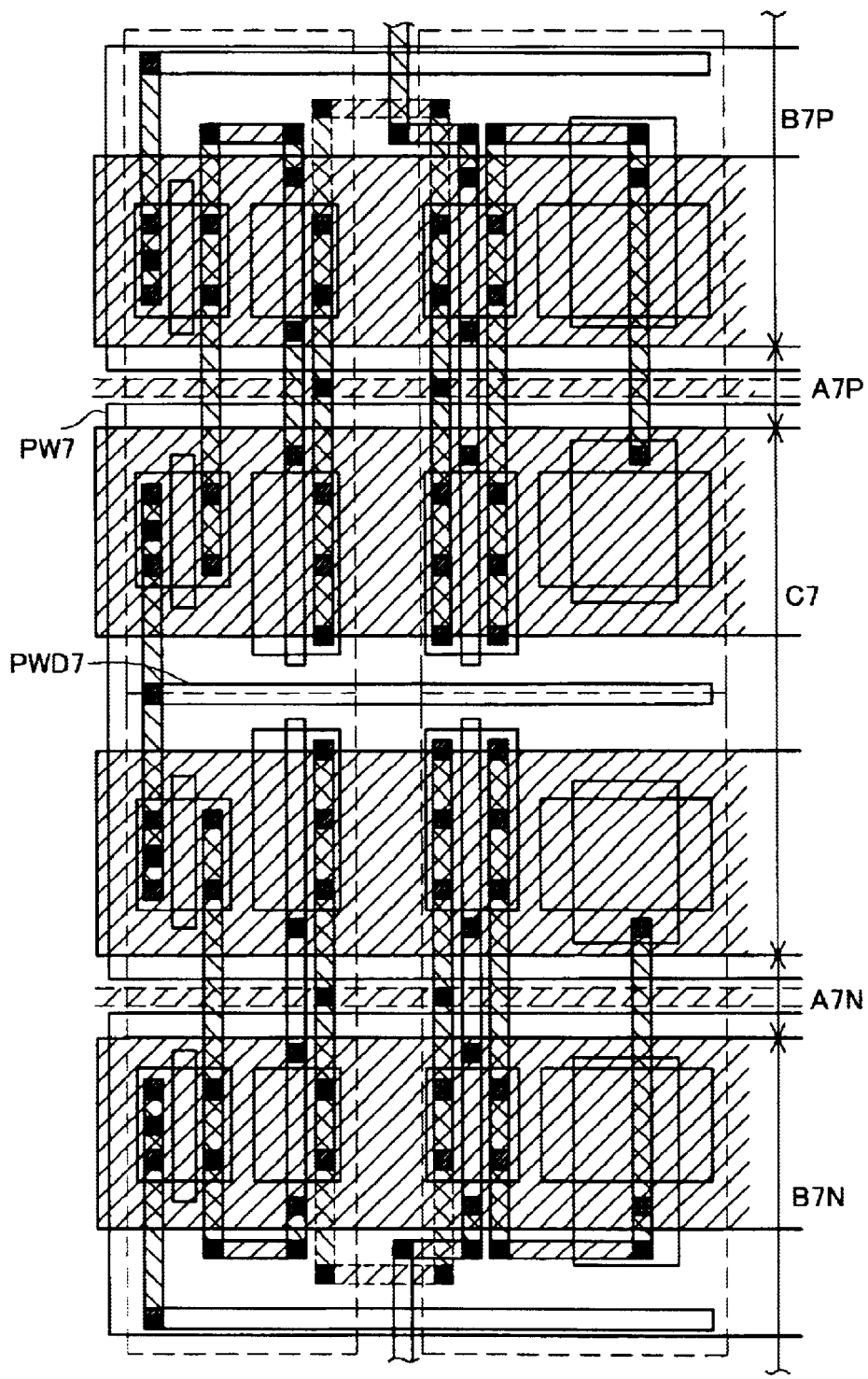
FIG. 7 is a layout diagram directed to Seventh Embodiment.

FIG. 7 directed to a Seventh Embodiment is a layout diagram generally corresponding to a plurality of layout diagrams of FIG. 2 directed to the Second Embodiment spread in a mirror reverse manner with reference to outer side of a reference voltage wiring VSS7. The layout diagram of FIG. 7 is structured such that a P-type well portion of the mirror reverse side and that of the original side are merged into one to constitute a larger P-type well region PW7 and, a diffused region PWD7 for ohmic contact is shared by the original side and the mirror reverse side so as to conduct bias-application to the P-type well region PW7.

According to the Seventh Embodiment, a unit connection wiring is not wired in the mirror reverse portion of a third region C7. Therefore, all what is required to decide is spacing among elements determined by device factors such as capability of keeping insulated state against voltage application among elements, and length of a wiring width in case an input/output wiring to a functional circuit is arranged, whereby minimum essential space for respective circuit elements can be set. This is convenient to enhance layout efficiency and realize higher integration design.

The merge of the P-type well region PW7 and sharing of the diffused region PWD7 for bias-application contribute to enhancement of layout efficiency. Structure such as the above is convenient for higher integration design.

Figure 8:
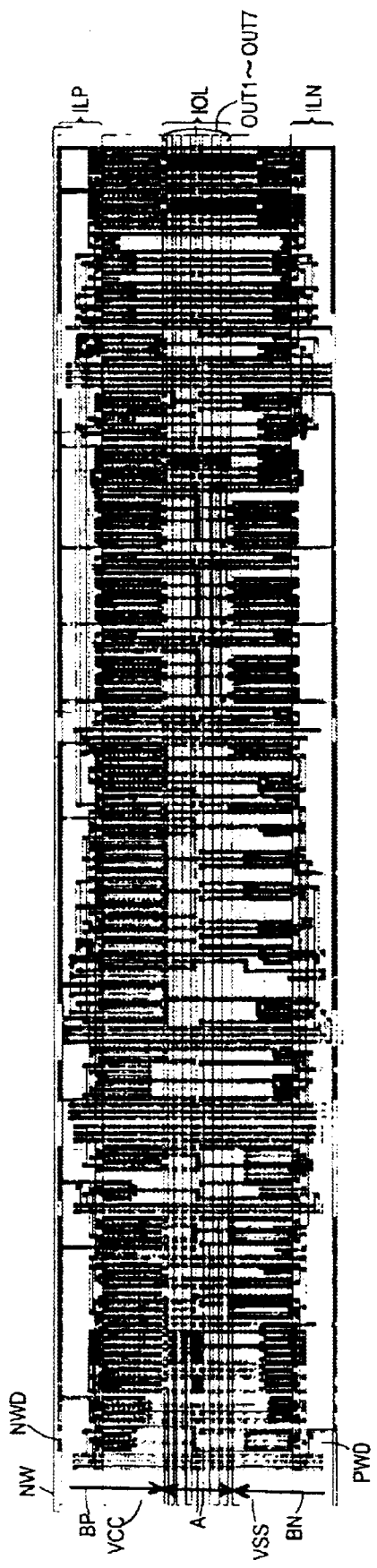
FIG. 8 shows a functional circuit directed to FIG. 23 laid-out with manners of First and Third Embodiments.
Figure 9:
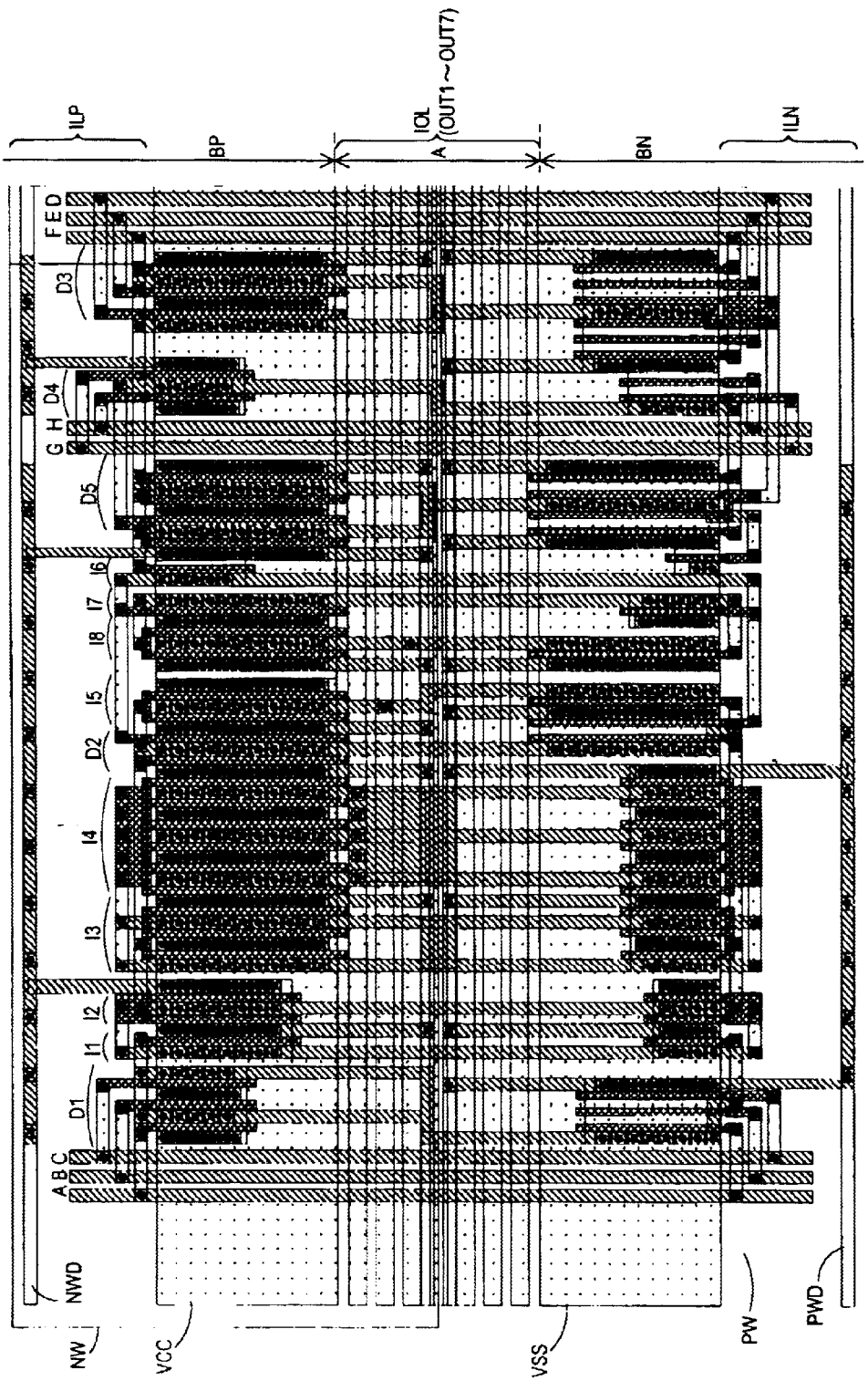
FIG. 9 shows a layout pattern of a logic circuit CIR1 directed to First and Third Embodiments.
Figure 10:
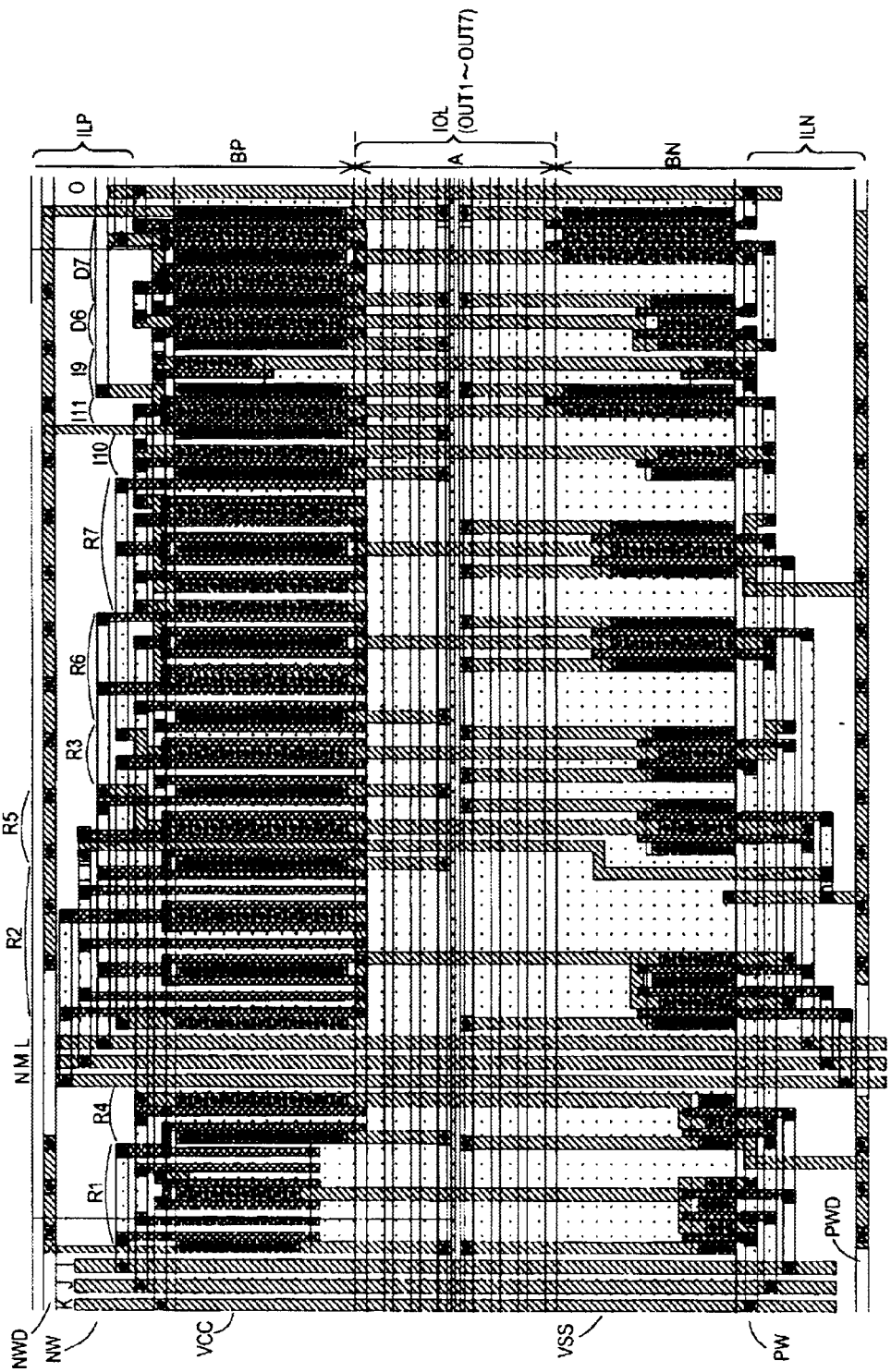
FIG. 10 shows a layout pattern of a logic circuit CIR2 directed to First and Third Embodiments.
Figure 11:
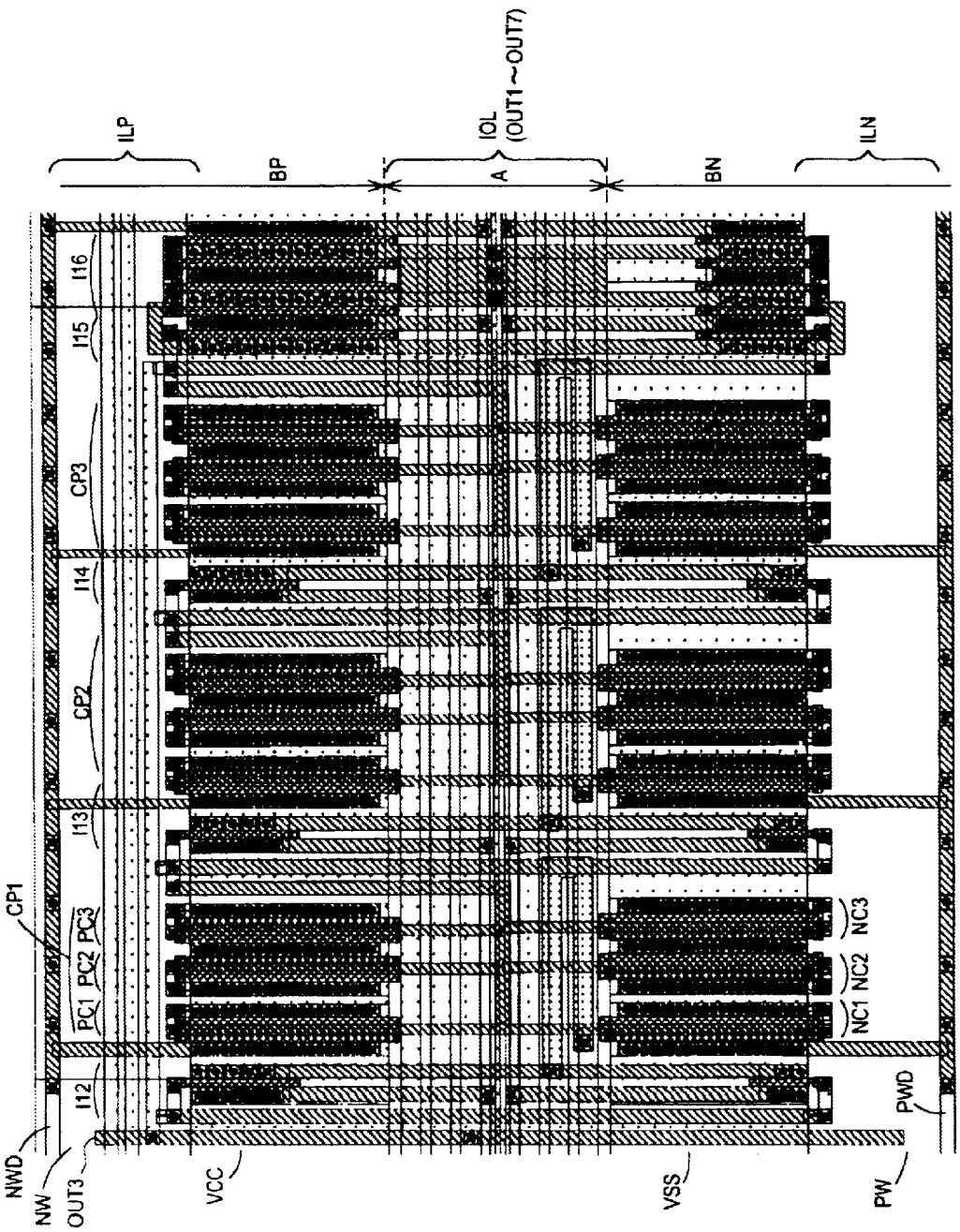
FIG. 11 shows a layout pattern of a logic circuit CIR3 directed to First and Third Embodiments.
Figure 12:
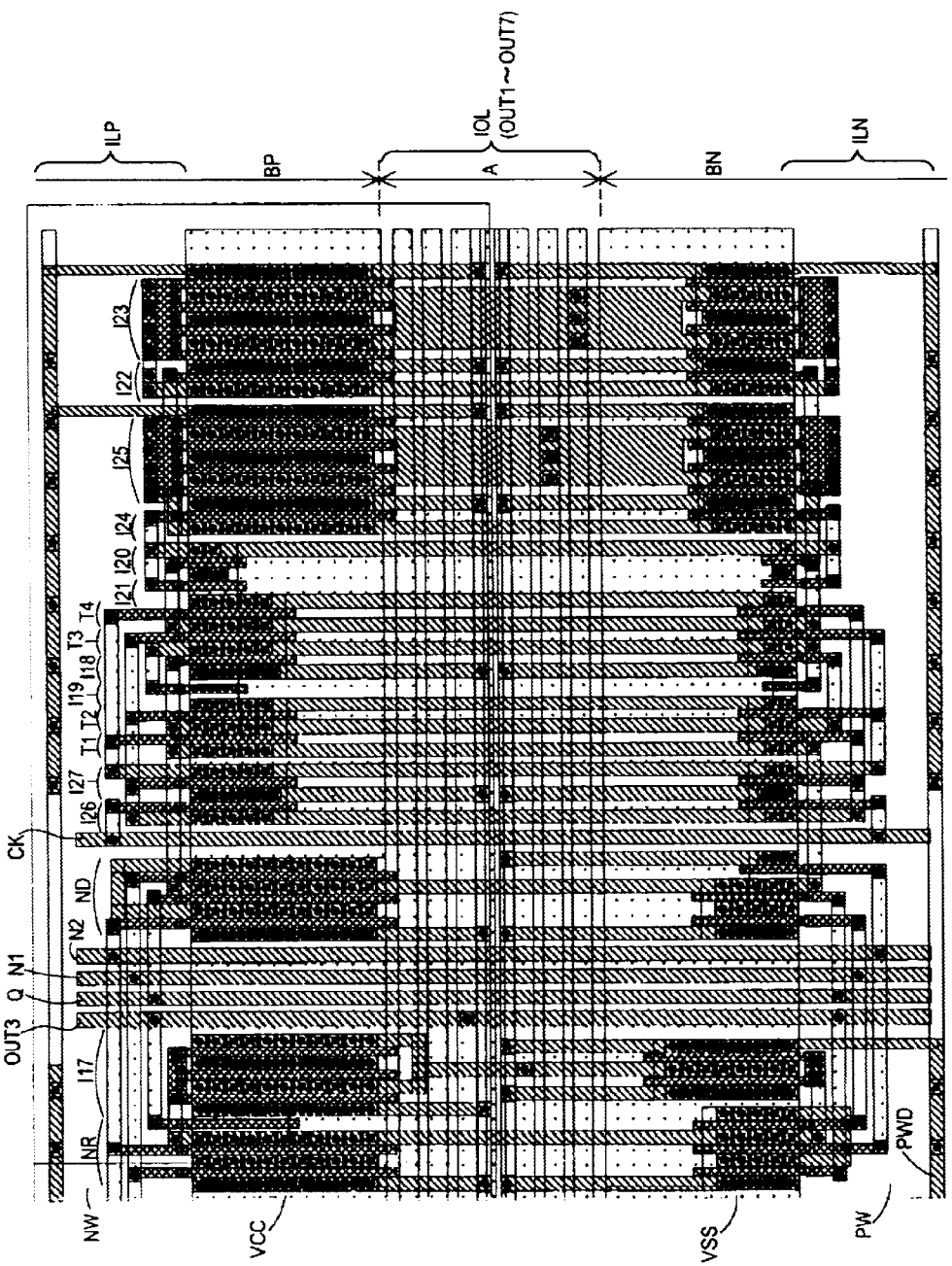
FIG. 12 shows a layout pattern of a logic circuit CIR4 directed to First and Third Embodiments.
Figure 23:
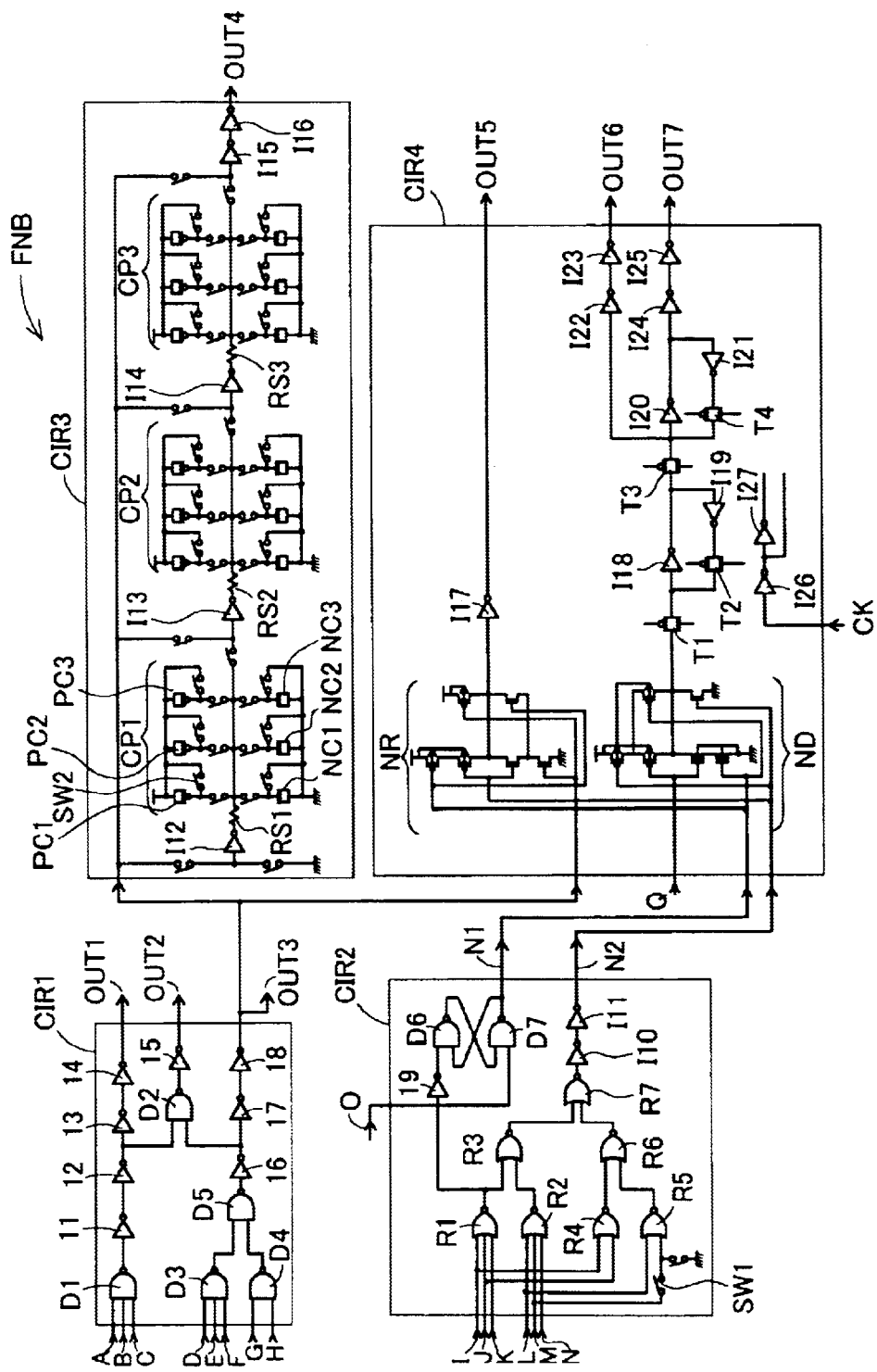
FIG. 23 is a circuit block diagram illustrating an example of a functional circuit.
Figure 24:
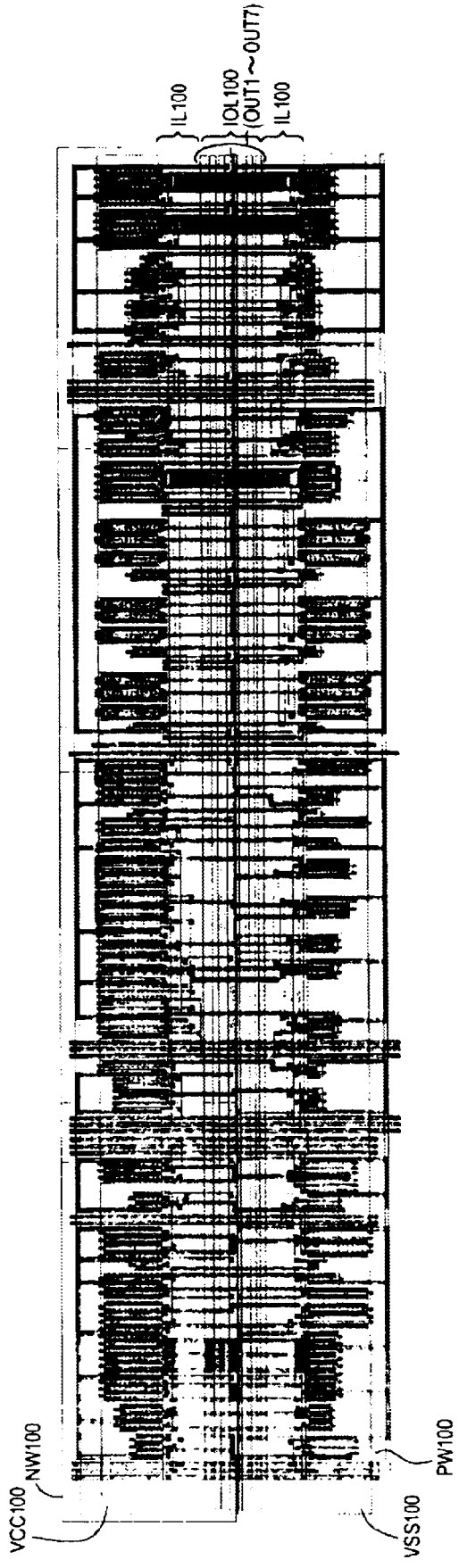
FIG. 24 is a layout pattern diagram showing an example of functional circuit directed to FIG. 23 laid-out with manners of prior art.
Figure 25:
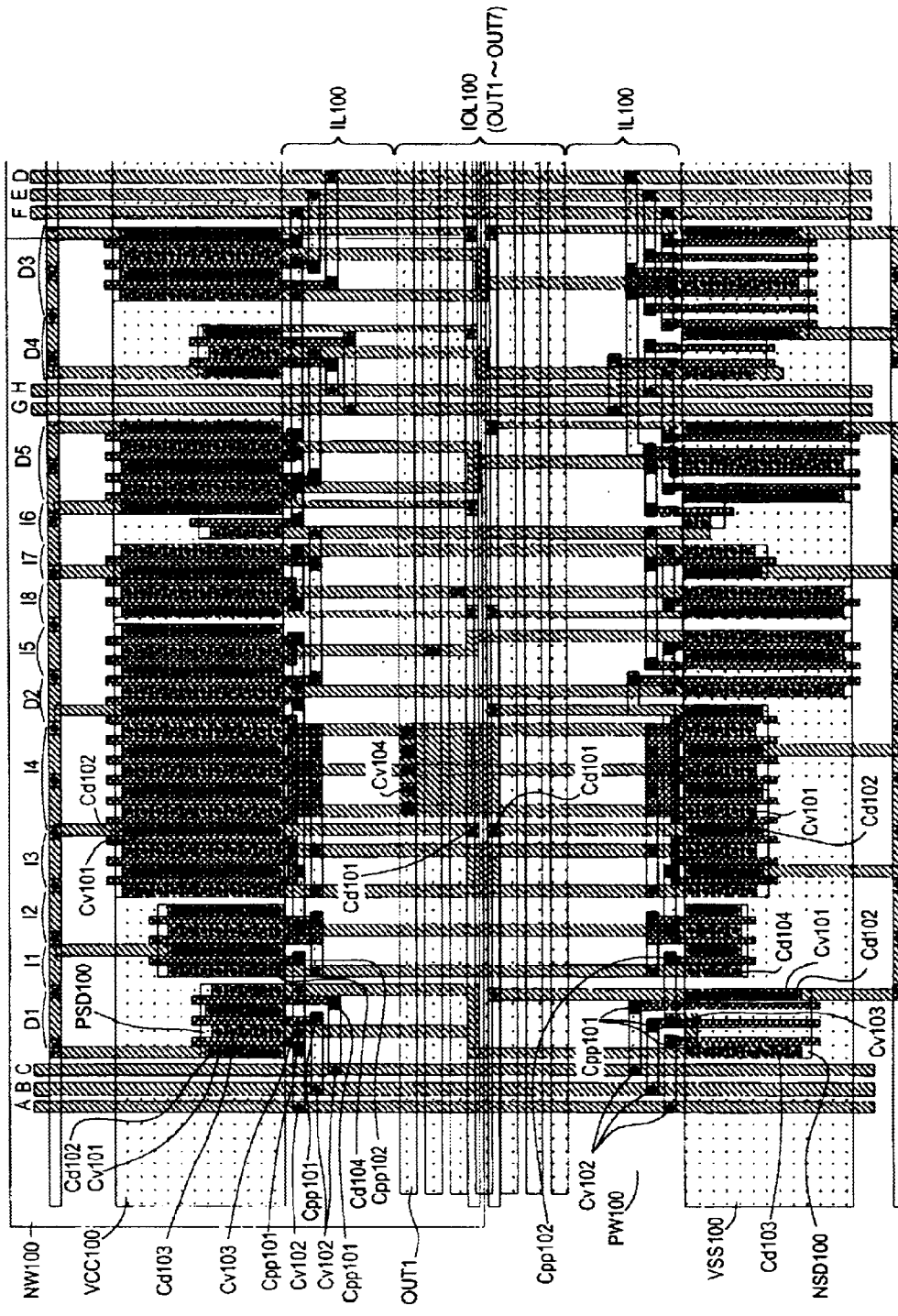
FIG. 25 shows a layout pattern of a logic circuit CIR1 directed to prior art.
Figure 26:
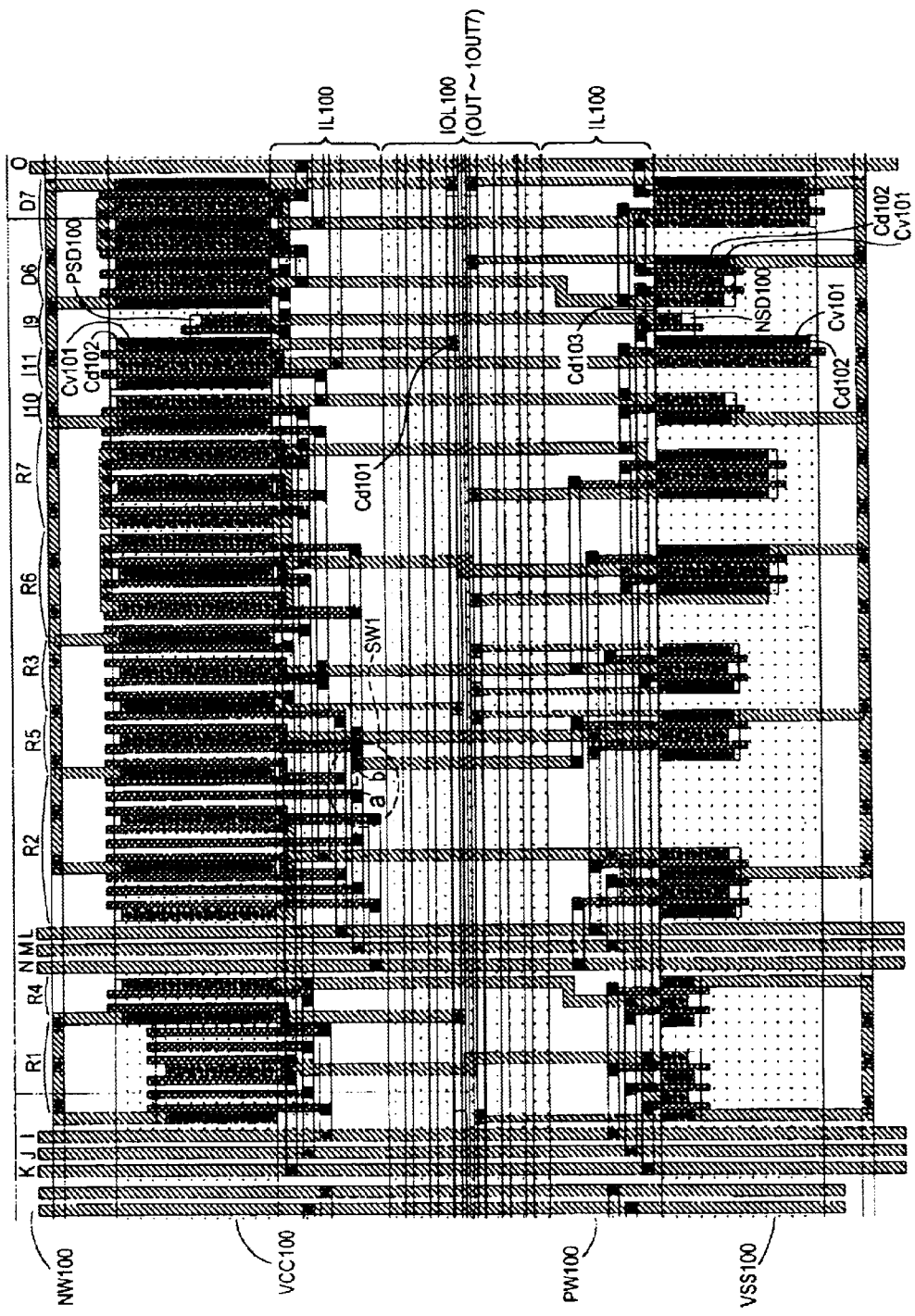
FIG. 26 shows a layout pattern of a logic circuit CIR2 directed to prior art.

FIG. 8 shows the functional circuit FNB directed to FIG. 23 laid-out in accordance with layout manners of the First and Third Embodiments. That is, in FIG. 8, there are arranged the unit wiring regions IL1P and IL1N outside of the power voltage wiring VCC1 and the reference voltage VSS1 as shown in the First Embodiment, and the outer edge of the PMOS transistors P31 through P34 and those of the NMOS transistors N31 through N34 are aligned with the outer edge of the power voltage wiring VCC3 and that of the reference voltage wiring VSS3, respectively close to the unit wiring regions IL1P and IL1N as shown in the Third Embodiment. Arrangement order of the logic circuits CIR1 through CIR4 is similar to FIG. 24 directed to the prior art. FIG. 9 through FIG. 12 show enlarged layout patterns of logic circuits CIR1 through CIR4, respectively. As to structural elements identical to those of the layout pattern directed to the prior art, same numerals are assigned to them and descriptions for them will be omitted.

In the functional circuit directed to FIG. 8 to which aspects of the First and Third Embodiments are applied, the following points are similar to the layout patterns of the prior art: (1) relationship between the PMOS transistors and the N-type well region; (2) relationship between the NMOS transistors and the P-type well region; and (3) structure of the input/output wiring region IOL wherein input/output wirings to the functional circuit are arranged on the first region A. Therefore, description regarding the above three aspects will be omitted. Furthermore, since the layout pattern of this embodiment is made in accordance with process B, the following points are also similar to the prior art: (1) connection structure among the first metal layer M1L through third metal layer M3L wherein contacts Cv and Cvv are used; and (2) connection structure between the PolySi layer and the second metal layer M2L wherein contacts Cpp connect the two layers; and (3) wiring direction of each wiring layer. Accordingly, descriptions of the above three aspects will be omitted, as well.

In this embodiment, there are arranged the PMOS transistors with theirs outer edge aligned with the outer edge of the power voltage wiring VCC without poking out from the outer edge, and further arranged the unit wiring region ILP outside of the power voltage wiring VCC. Furthermore, there are also arranged the NMOS transistors with theirs outer edge aligned with the outer edge of the reference voltage wiring VSS without poking out from the outer edge and, and further arranged the unit wiring region ILN outside of the reference voltage wiring VSS. The diffused regions NWD and PWD are arranged outside of the unit wiring regions ILP, ILN, respectively, so as to apply bias to N-type well region NW and P-type well region PW.

A unit wiring regions ILP and ILN do not exist in a first region A located between a power voltage wiring VCC and a reference voltage VSS but there exists an input/output wiring region IOL on which input/output wirings OUT1 through OUT7 running through the entire layout pattern of the functional circuit. Accordingly, an empty region or non-wiring region will never be left in the first region A as unnecessary region. Thereby, layout efficiency is enhanced and higher integration design can be realized.

Furthermore, since unnecessary region such as empty region does not exist in the first region A, the PMOS transistors and the NMOS transistors can be connected with a minimum distance. Still further, the outer edge of the PMOS transistors and the outer edge of the NMOS transistors are aligned with the outer edge of the power voltage wiring VCC and the outer edge of the reference voltage wiring VSS, respectively, which makes it possible to minimize distance between the unit wiring regions ILP and ILN. Accordingly, parasitic resistance, parasitic capacitance and the like due to connection wiring can be reduced to minimum, and there never occurs signal delay difference in the CMOS units, whereby unit characteristics can be maintained preferably. As specific effects of the above, parasitic resistance in the drain wirings of the PMOS/NMOS transistors can be reduced. For example, at the inverter gate I5 in the logic circuit CIR1, an eighteen-sheet of sheet resistance (sheet resistance is equal to wiring length/wiring width) can be reduced, compared with the conventional layout pattern. Assuming that sheet resistance of the first metal layer M1L (for connection wiring) is 3 Ω, of about 60 Ω can be reduced therein. Assuming that drive load capacitance including parasitic capacitance of the inverter gate I5 is 1 pF, of about 0.06 n as time constant can be shorten. In a semiconductor integrated circuit device that operates faster than several hundred MHz, this shortening of time constant significantly contributes to suppress of timing skew of internal signals. Furthermore, for critical path to which this time constant is added, the shortening of time constant directly contributes to shortening of signal transmission delay time and is indispensable matter to enhance higher operation speed.

Furthermore, it is possible to minimize areas for the well regions NW and PW. Thereby, capability of anti-latch-up can be secured and there can be realized stabilization of element characteristics, which derives from stabilization of back-gate bias for the PMOS/NMOS transistors.

Since the PMOS/NMOS transistors are arranged inside of the outer edges of the power voltage wiring VCC and the reference voltage wiring VSS, each of the unit wiring regions ILP and ILN is never narrowed due to the positioning of the PMOS/NMOS transistors. Thereby, layout efficiency can be enhanced.

Figure 20:
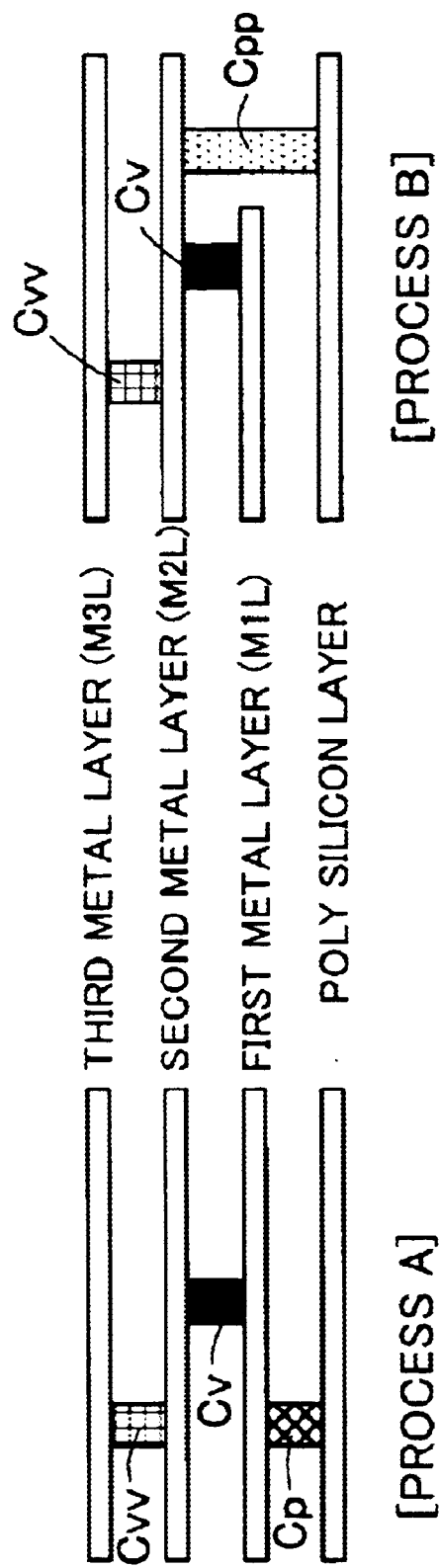
FIG. 20 is a diagram to explain multi-layered wiring structure at each manufacturing process of a semiconductor integrated circuit device.

This embodiment describes the structure such that the unit wiring regions ILP and ILN are arranged outside of the power voltage wiring VCC and the reference voltage wiring VSS, respectively. However, circuit layout is not limited to the above. For example, the unit wiring regions ILP and ILN can be arranged either one of the outside of the power voltage wiring VCC and that of the reference voltage wiring VSS. In this case, in the first region A, there should be wired a connection wiring with first metal layer M1L for connecting the PMOS/NMOS transistors crossing the input/output wiring region IOL on which the input/output wiring for the second metal layer M2L is arranged. Accordingly, specification process of this case corresponds to process B directed to FIG. 20.

Figure 13:
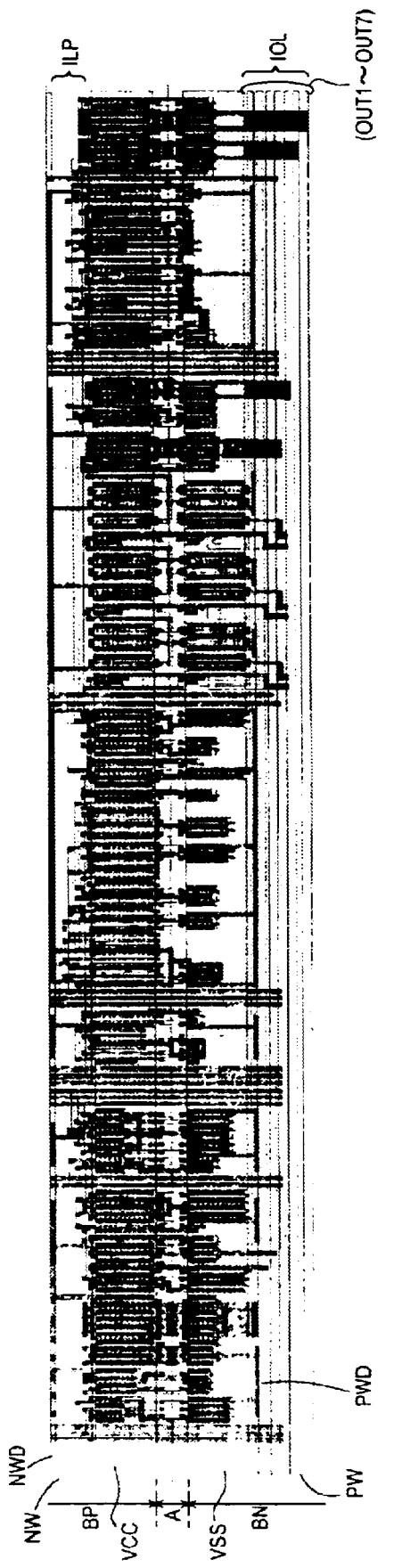
FIG. 13 shows a functional circuit directed to FIG. 23 laid-out with manners of Fourth Embodiment.

FIG. 13 corresponds to the functional circuit FNB directed to FIG. 23 laid-out with manners of the Fourth Embodiment. Arrangement order of the logic circuits CIR1 through CIR 4 is the same as FIG. 24 directed to the prior art. FIG. 14 through FIG. 17 show enlarged layout patterns of logic circuits CIR1 through CIR4, respectively. As to structural elements identical to those of the layout pattern directed to the prior art, same numerals are assigned to them and descriptions for them will be omitted.

In a typical example of the Fourth Embodiment shown in FIG. 13, the following points are similar to the layout patterns of the prior art: (1) relationship between the PMOS transistors and the N-type well region; and (2) relationship between the NMOS transistors and the P-type well region. Therefore, description regarding the above two aspects will be omitted. Furthermore, since the layout pattern of this example is made in accordance with process B shown in FIG. 20, the following points are also similar to the prior art: (1) wiring directions of the first metal layer M1L through the third metal layer M3L, and the PolySi layer; and (2) connection structure among the above wiring layers wherein contacts Cv, Cvv, and Cpp are used. Description of the above two aspects will be omitted, as well.

In this embodiment, there are arranged the PMOS transistors with theirs outer edge aligned with the outer edge of the power voltage wiring VCC without poking out from the outer edge, and further arranged the unit wiring region ILP outside of the power voltage wiring VCC. Furthermore, there are also arranged the NMOS transistors with theirs inner edge aligned with the inner edge of the reference voltage wiring VSS without poking out from the inner edge and, and further arranged the input/output wiring region IOL outside of the reference voltage wiring VSS. The diffused region NWD is arranged outside of the unit wiring region ILP so as to apply bias to N-type well region NW. Incidentally, the diffused region PWD for applying bias to the P-type well region PW is arranged between the reference voltage wiring VSS and the input/output wiring region IOL.

Neither a unit wiring region nor an input/output wiring region are arranged in the first region A located between the power voltage wiring VCC and the reference voltage wiring VSS. Accordingly, an empty region or non-wiring region will never be left in the first region A as unnecessary region. Since width of the first region A is determined by layout specification such as capability of keeping insulated state against voltage application between the PMOS/NMOS transistors, the width can be shortened to a minimum essential. Thereby, layout efficiency of functional circuit is enhanced and higher integration design can be realized.

Since the width of the first region A is shortened to a minimum essential and the inner edge of the NMOS transistors is aligned with the inner edge of the reference voltage wiring VSS, the PMOS transistors and the NMOS transistors can be connected with a minimum distance. Furthermore, the outer edge the PMOS transistors is aligned with the outer edge of the power voltage wiring VCC, thereby to minimize distance to reach unit wiring region ILP from each element. Accordingly, parasitic resistance, parasitic capacitance and the like due to connection wiring can be reduced to minimum, and there never occurs signal delay difference in the CMOS units, whereby unit characteristics can be maintained preferably. As specific effects of the above, parasitic resistance in the drain wirings of the PMOS/NMOS transistors can be reduced, similar to the example directed to FIG. 8.

Furthermore, it is possible to minimize areas for the well regions NW and PW. Thereby, the capability of anti-latch-up can be secured and there can be realized stabilization of element characteristics, which derives from stabilization of back-gate bias for the PMOS/NMOS transistors.

Since the PMOS/NMOS transistors are arranged inside of the power voltage wiring VCC and the reference voltage wiring VSS, each unit wiring region ILP and each input/output wiring region IOL are never narrowed due to the positioning of the PMOS/NMOS transistors. Thereby, layout efficiency can be enhanced.

Figure 14:
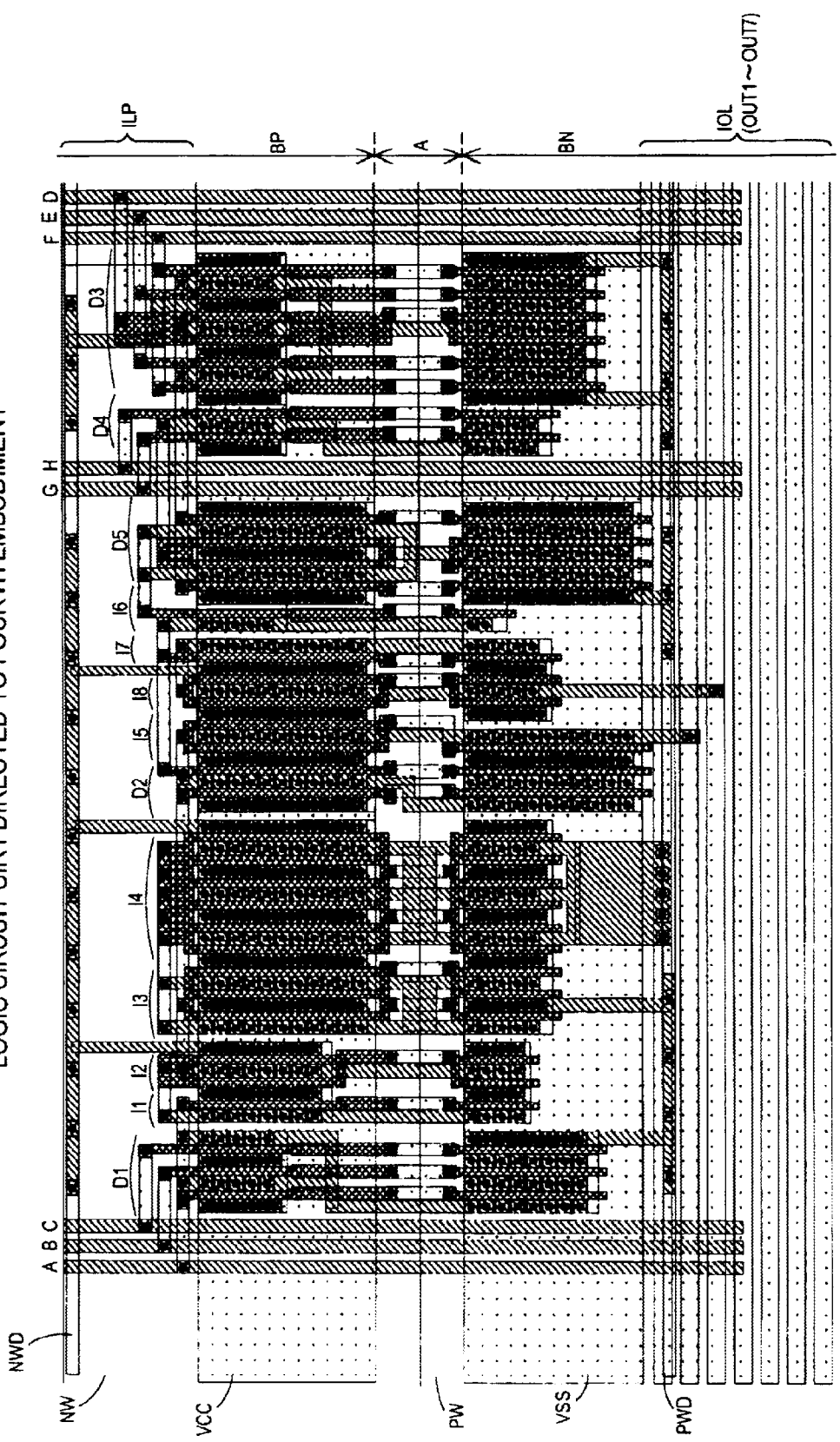
FIG. 14 shows a layout pattern of a logic circuit CIR1 directed to Fourth Embodiment.
Figure 15:
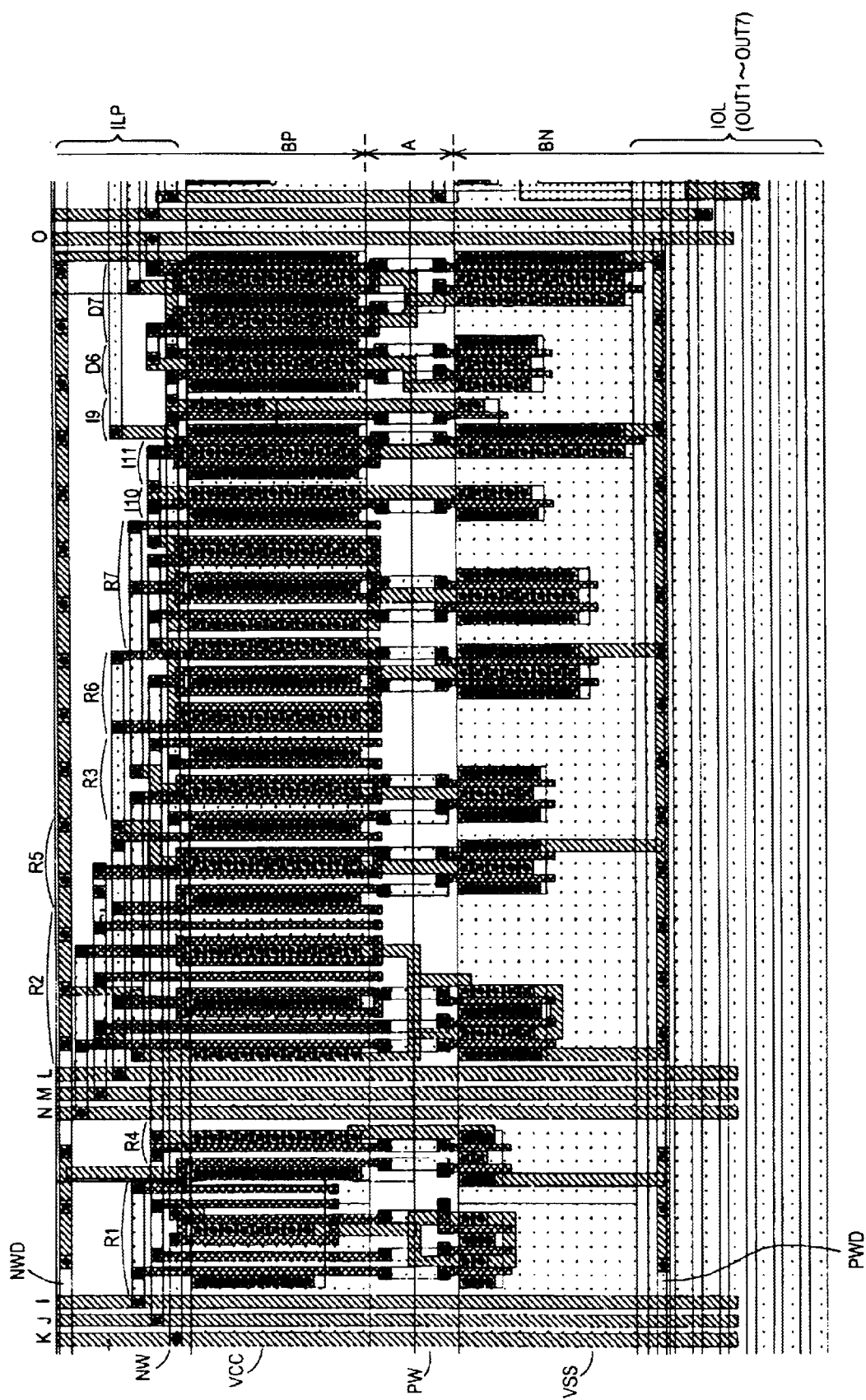
FIG. 15 shows a layout pattern of a logic circuit CIR2 directed to Fourth Embodiment.
Figure 16:
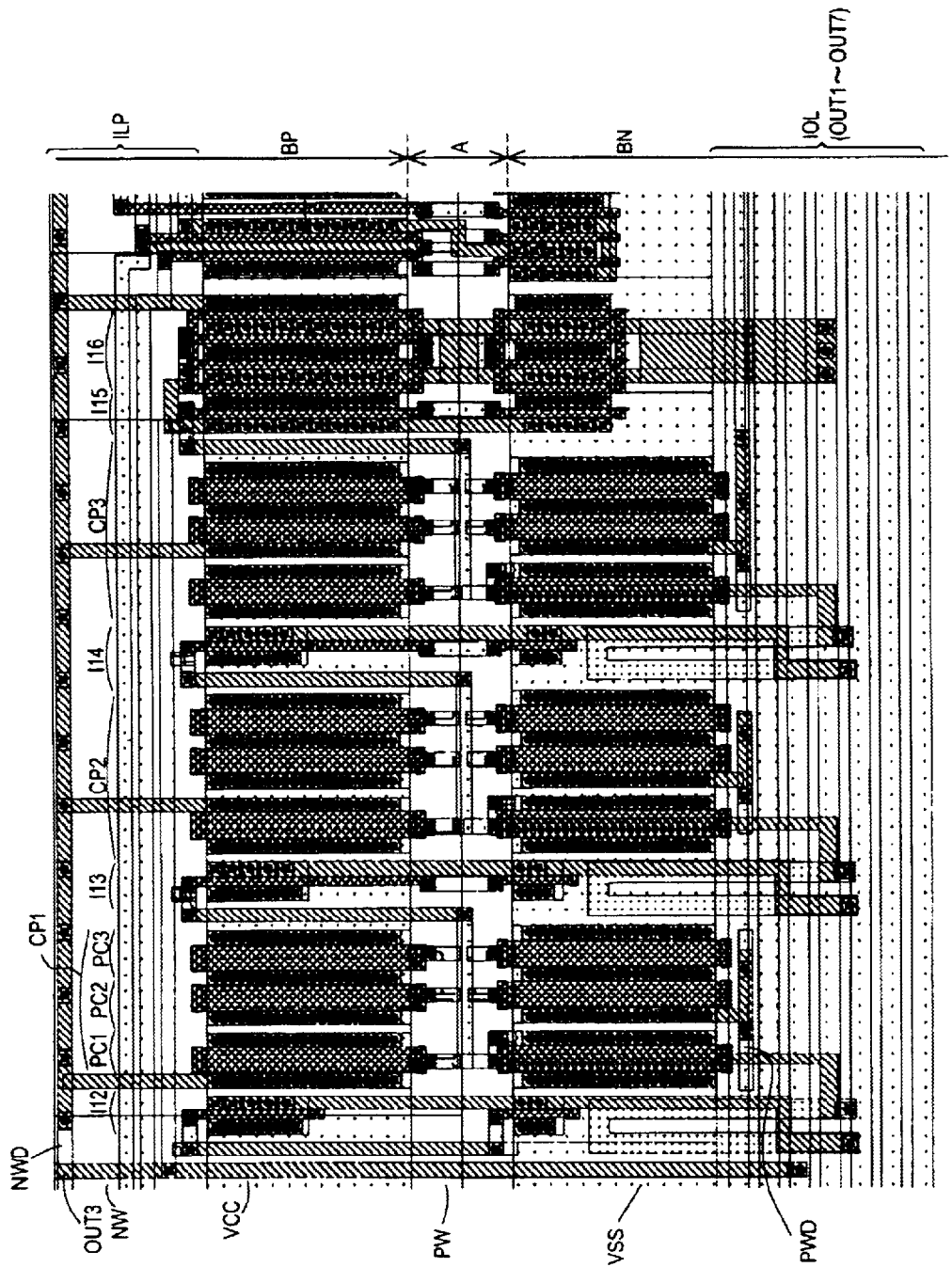
FIG. 16 shows a layout pattern of a logic circuit CIR3 directed to Fourth Embodiment.
Figure 17:
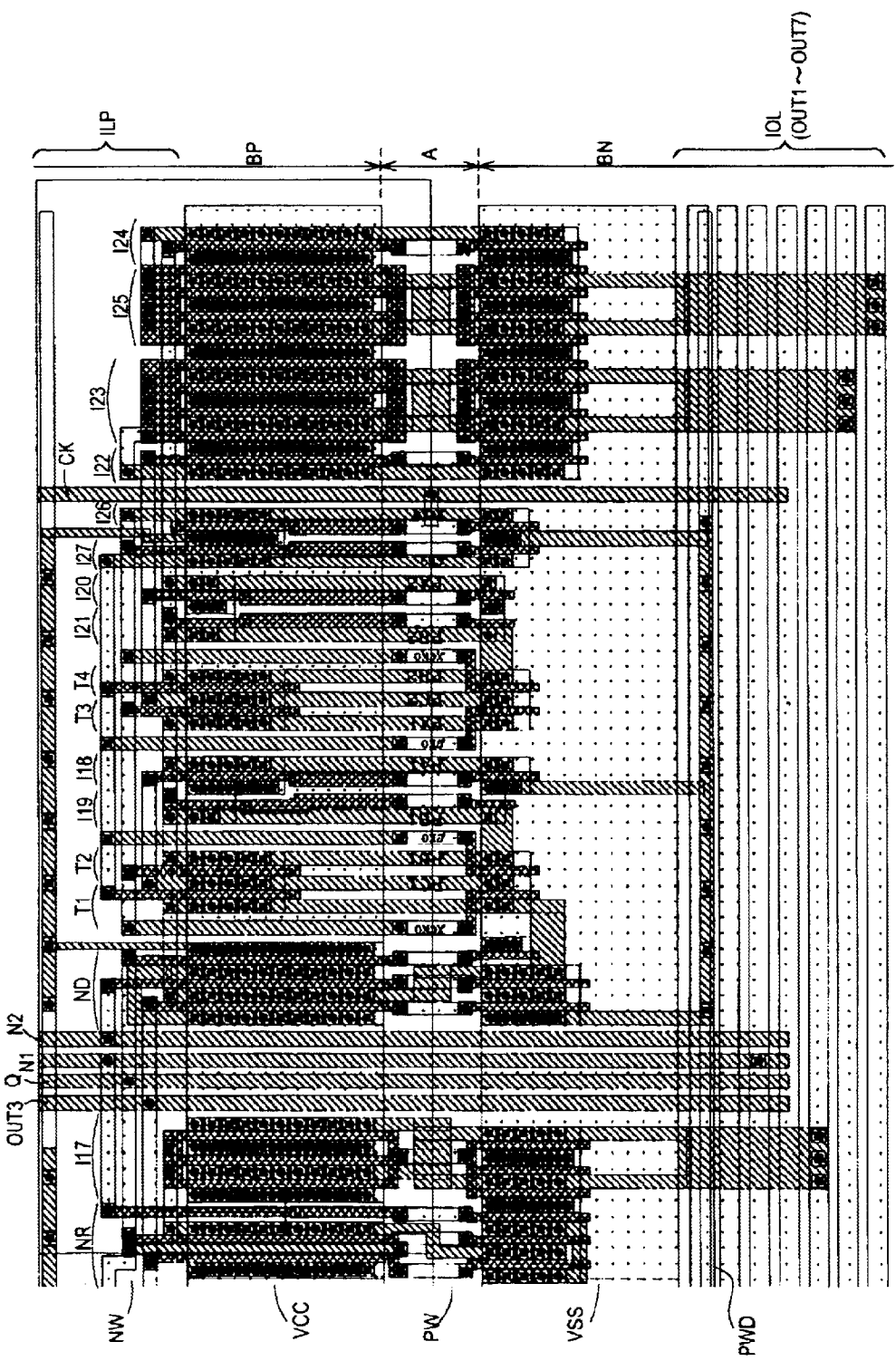
FIG. 17 shows a layout pattern of a logic circuit CIR4 directed to Fourth Embodiment.
Figure 18:
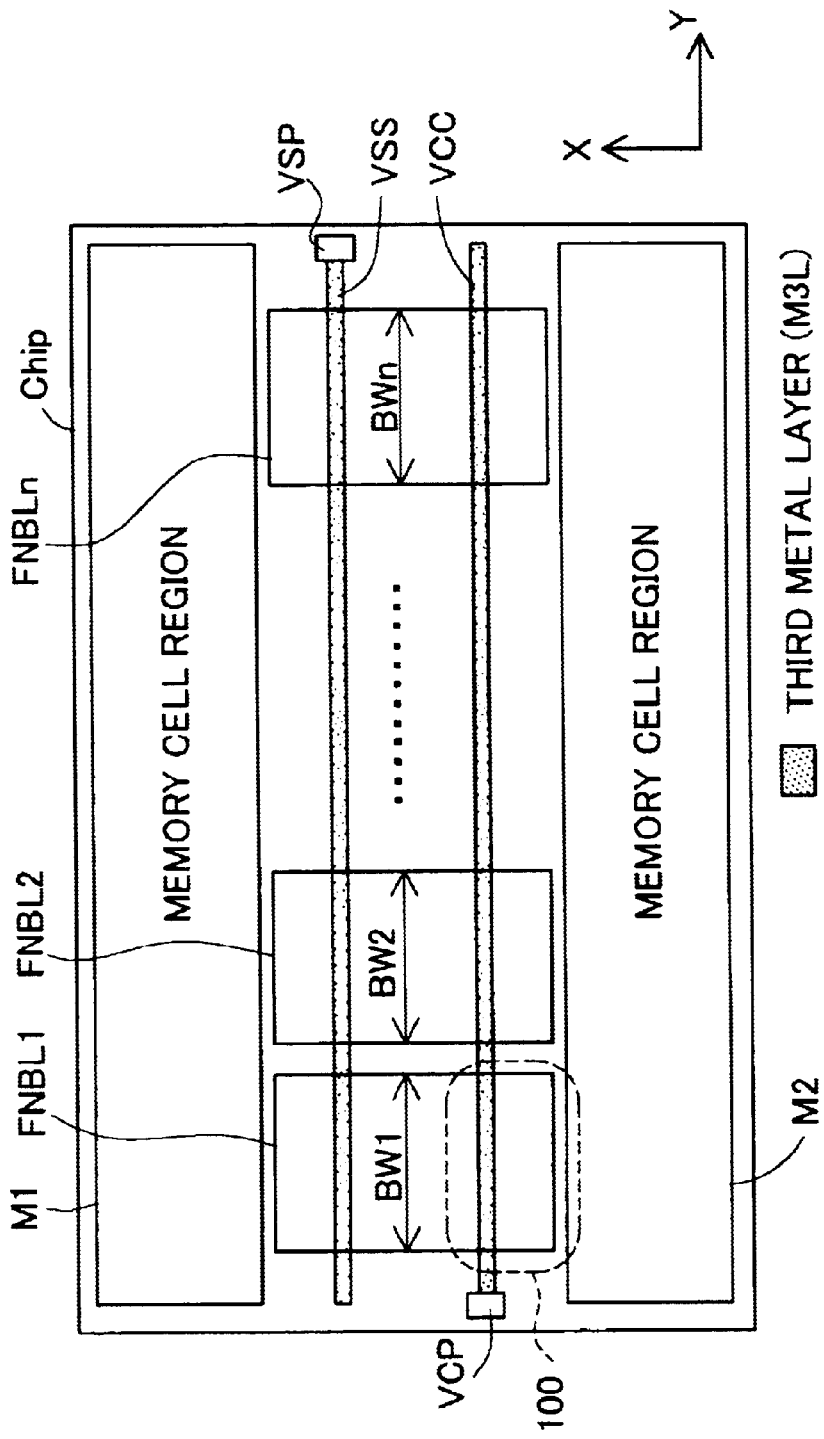
FIG. 18 is a layout of a functional circuit group on a semiconductor integrated circuit device.
Figure 19:
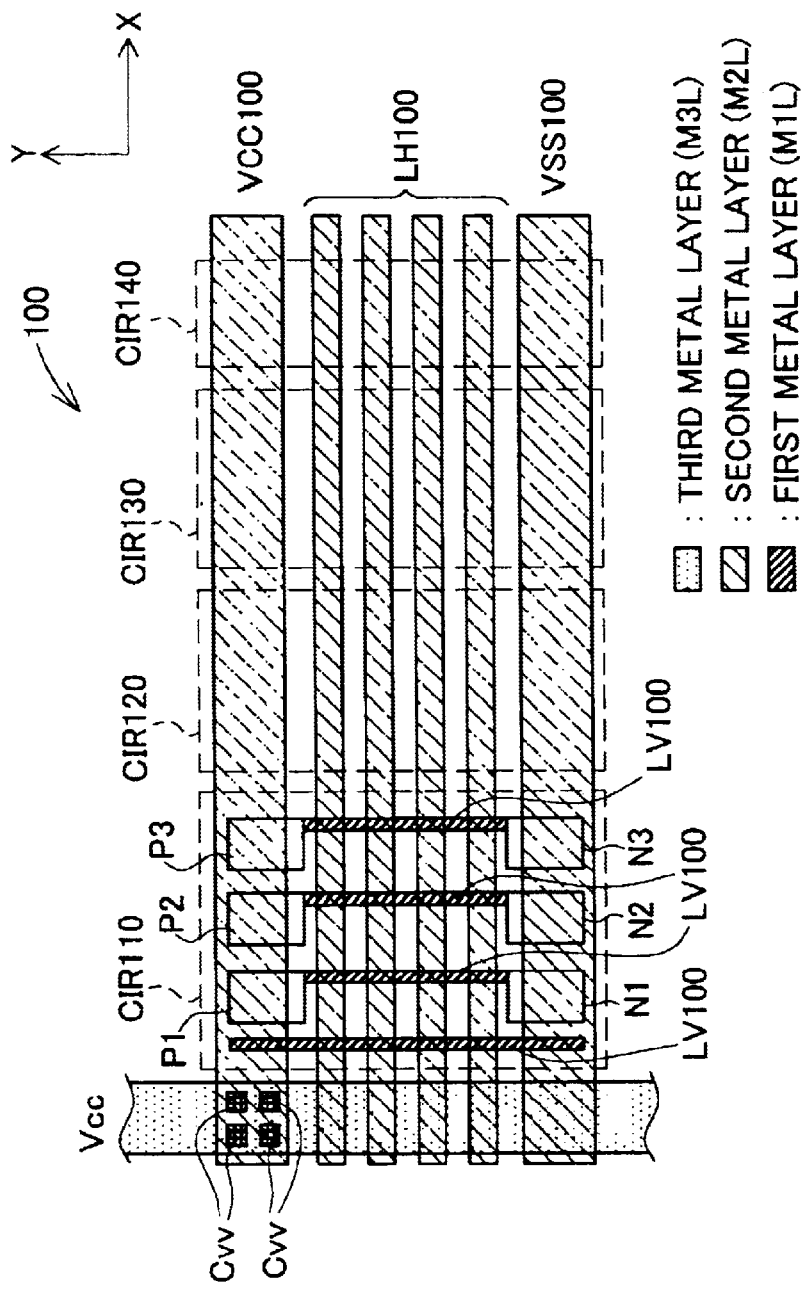
FIG. 19 is a diagram showing a part of functional circuit group enlarged.

Here, the structure of the NAND gate circuit, in case that the unit wiring region ILP is arranged outside of the power voltage wiring VCC, will be described by referring to FIG. 14 and FIG. 15 as examples. FIG. 14 shows the NAND gate circuit D1 through D5 for the logic circuit CIR1 and FIG. 15 shows the NAND gate circuits D6 and D7 for the logic circuit CIR2. In this case, it is preferable that the number of PMOS transistor gates and that of the NMOS transistor gates that constitute the NAND gate circuit D1 through D6 are the same. Since a terminal of each PMOS transistor and that of each NMOS transistor faces to each other, a wiring layer can linearly connect between the terminals without taking lengthy detours from the unit wiring region ILP. Furthermore, as the NAND gate circuit D7 shows, even though the number of PMOS transistor gates is set lager than that of the NMOS transistor gates, connection wiring can be wired without taking lengthy detours. It should be noted that the NAND gate circuit has a particular structure such that the ratio of gate width of PMOS transistor to that of NMOS transistor is 4:1.

As to the NOR gate circuit, let take the NOR gate circuits R1 and R4 for the logic circuit CIR2 in FIG. 15 as an example. It is preferable that the number of PMOS transistor gates is set larger than that of the NMOS transistor gates, similar to the NOR gate circuit R1, or the number of PMOS transistor gates is set the same as that of the NMOS transistor gates, similar to the NOR gate circuit R4. Since a terminal of each PMOS transistor and that of each NMOS transistor face to each other, a wiring layer can linearly connect between the terminals without taking lengthy detours from the unit wiring region ILP.

In case that the unit wiring region ILN is arranged outside of the reference voltage wiring VSS, contrary to this example, relationship between the number of the PMOS transistor gates and that of the NMOS transistor gates, which is specified above, should be set adversely. That is, for the NAND gate circuit, the number of NMOS transistor gates is set larger than that of the PMOS transistor gates, or the number of NMOS transistor gates is set the same as that of the PMOS transistor gates.

This example describes the structure such that the unit wiring region ILP and the input/output wiring region IOL are arranged outside of the power voltage wiring VCC and outside of the reference voltage wiring VSS, respectively. However, the unit wiring regions ILP, ILN and the input/output wiring region IOL may be arranged outside of the power voltage wiring VCC and outside of the reference voltage wiring VSS. In that case, there is only wired first metal layer M1L for connecting between drain terminals of the PMOS/NMOS transistors on the first region A. For gate terminals of the PMOS transistors, connection wirings are supplied from the unit wiring region ILP arranged at the side of the power voltage wiring region VCC, and for gate terminals of the NMOS transistors, connection wirings are supplied from the unit wiring region ILN arranged at the side of the reference voltage wiring region VSS.

Furthermore, both the unit wiring region ILP and the input/output wiring region IOL may be arranged at either one of the sides of the power voltage wiring VCC or the reference voltage wiring VSS. In that case, there is wired only first metal layer M1L for connecting between the drain terminals of the PMOS/NMOS transistors on the first region A.

The present invention is not limited to the forgoing First through Seventh Embodiments, but various modifications and alternation are obviously possible within the scope of the substance of the invention.

Unit wiring regions, input/output wiring regions can be appropriately arranged anywhere within first through third region other than the regions mentioned in the embodiments, as long as the arrangements can enhance layout efficiency, prevent component elements from deteriorating characteristically, or can simplify layout design change.

In each embodiment, it is described that which manufacturing process, namely, process A or process B, the layout pattern applies thereto and how the layout patterning goes along with the manufacturing process applied thereto. However, it is possible that embodiments change manufacturing processes among them or that an embodiment applies a manufacturing process other than the process A and process B thereto.

According to the present invention, in layout patterns of the inventive semiconductor integrated circuit device wherein functional circuit groups are arranged in one direction on a chip, internal connection wirings between the CMOS units and between logic circuits are arranged outside of the power voltage wiring and the reference voltage wiring. Thereby, a width for a region between the power voltage wiring and the reference voltage wiring can be shortened to a minimum essential so that an empty region or non-wiring region will never be left in the region as unnecessary region. Thereby, layout efficiency is enhanced and higher integration design can be realized.

Furthermore, since width of a space between the power voltage wiring and the reference voltage wiring can be shortened to a minimum essential, PMOS transistors and NMOS transistors can be connected to one another by the shortest route. As a result, parasitic element component of the connection wiring can be reduced to minimum. Areas of well regions can be minimized, as well. Hence characteristic of CMOS unit constituted by connecting a PMOS transistor and an NMOS transistor can be enhanced and capability of anti-latch-up can be prevented from deteriorating.

Furthermore, the present invention simplifies estimation of space to be taken between a power voltage wiring and a reference voltage wiring at an initial stage of layout design. Even if circuit design is changed and internal connection wiring must be added thereto accordingly after positioning of the power voltage wiring and the reference voltage wiring has been determined, the internal connection wiring can be added thereto without relocating the power voltage wiring and the reference voltage wiring. Therefore, layout design can be made in a short time.

What is claimed is:

1. A semiconductor integrated circuit device comprising:
   a pair of a first power wiring and a second power wiring, the pairs being arranged in one direction, wherein a first region between the first power wiring and the second power wiring;
   fundamental circuit units constituted by combining one or more PMOS transistors and one or more NMOS transistors, the fundamental circuit units being arranged along with the first power wiring and the second power wiring;
   logic circuit units constituted by a plurality of the fundamental circuit units;
   functional circuit units constituted by a plurality of the logic circuit units, the functional circuit units being connected each other; wherein
      at least one part of the PMOS transistors and that of the NMOS transistors are arranged below the first power wiring and the second power wiring; and
      unit connection wirings to connect between the fundamental circuit units or to connect between the logic circuit units, of which terminals terminate at the functional circuit units are arranged on second regions that are other than the first region, in case the unit connection wirings are constituted by a layer that is same as a wiring layer that constitutes the first power wiring and the second power wiring or by wiring layers that are under the wiring layer of the first and second power wirings.

2. A semiconductor integrated circuit device according to claim 1, wherein PMOS transistors and an N-type well region that surrounds the PMOS transistors are arranged under the first power wiring along the first power wiring, and NMOS transistors and a P-type well region that surrounds the NMOS transistors are arranged under the second power wiring along the second power wiring.

3. A semiconductor integrated circuit device according to claim 1, wherein the unit connection wirings are arranged on regions that are parts of the second regions and outside of the PMOS transistors and the NMOS transistors.

4. A semiconductor integrated circuit device according to claim 3, wherein the unit connection wirings are arranged on a part of the second region that is at the first power wiring side, and the PMOS transistors are included in the first power wiring.

5. A semiconductor integrated circuit device according to claim 3, wherein the unit connection wirings are arranged on a part of the second region that is at the second power wiring side, and the NMOS transistors are included in the second power wiring.

6. A semiconductor integrated circuit device according to claim 4, wherein the PMOS transistors are arranged in a manner that their edge at a side of the unit connection wirings is aligned with an edge at a side of the unit connection wirings for the first power wiring.

7. A semiconductor integrated circuit device according to claim 5, wherein the PMOS transistors are arranged in a manner that their edge at a side of the unit connection wirings is aligned with an edge at a side of the unit connection wirings for the first power wiring.

8. A semiconductor integrated circuit device according to claim 4, wherein the NMOS transistors are arranged in a manner that their edge at a side of the unit connection wirings is aligned with an edge at a side of the unit connection wirings for the second power wiring.

9. A semiconductor integrated circuit device according to claim 5, wherein the NMOS transistors are arranged in a manner that their edge at a side of the unit connection wirings is aligned with an edge at a side of the unit connection wirings for the second power wiring.

10. A semiconductor integrated circuit device according to claim 4, wherein in case the fundamental circuit units constitute a first NAND gate, the number of gates for the NMOS transistors is same as that for the PMOS transistors in a layout pattern of the first NAND gate.

11. A semiconductor integrated circuit device according to claim 4, wherein in case the fundamental circuit units constitute a first NOR gate, the number of gates for the PMOS transistors is same or larger than that for the NMOS transistors in a layout pattern of the first NOR gate.

12. A semiconductor integrated circuit device according to claim 5, wherein in case the fundamental circuit units constitute a second NAND gate, the number of gates for the NMOS transistors is same or larger than that for the PMOS transistors in a layout pattern of the second NAND gate.

13. A semiconductor integrated circuit device according to claim 5, wherein in case the fundamental circuit units constitute a second NOR gate, the number of gates for the NMOS transistors is same as that for the PMOS transistors in a layout pattern of the second NOR gate.

14. A semiconductor integrated circuit device according to claim 4, wherein two pairs of the functional circuit unit groups arranged with multi-staged structure on demand are arranged in a mirror reverse manner with reference to an edge opposite to an arrangement region of the unit connection wirings.

15. A semiconductor integrated circuit device according to claim 5, wherein two pairs of the functional circuit unit groups arranged with multi-staged structure on demand are arranged in a mirror reverse manner with reference to an edge opposite to an arrangement region of the unit connection wirings.

16. A semiconductor integrated circuit device according to claim 14, wherein in the two pairs of the functional circuit unit groups arranged in a mirror reverse manner, a well region that surrounds same-conductive type transistors arranged in a mirror reverse manner is shared by the two pairs of the functional circuit unit groups.

17. A semiconductor integrated circuit device according to claim 15, wherein in the two pairs of the functional circuit unit groups arranged in a mirror reverse manner, a well region that surrounds same-conductive type transistors arranged in a mirror reverse manner is shared by the two pairs of the functional circuit unit groups.

18. A semiconductor integrated circuit device according to claim 16, wherein a contact region for applying bias to the well region is shared by the two pairs of the functional circuit unit groups.

19. A semiconductor integrated circuit device according to claim 17, wherein a contact region for applying bias to the well region is shared by the two pairs of the functional circuit unit groups.

* * * * *